United States Patent
Song et al.

(10) Patent No.: US 12,535,444 B2
(45) Date of Patent: Jan. 27, 2026

(54) DOPED COLLOIDAL METAL OXIDE QUANTUM WIRE AND PREPARATION METHOD THEREOF, GAS SENSOR, GAS SENSOR ARRAY AND USE THEREOF

(71) Applicant: JIANGSU UNIVERSITY, Jiangsu (CN)

(72) Inventors: Zhilong Song, Jiangsu (CN); Jia Yan, Jiangsu (CN); Hui Xu, Jiangsu (CN); Huaming Li, Jiangsu (CN)

(73) Assignee: JIANGSU UNIVERSITY (CN)

( * ) Notice: Subject to any disclaimer, the term of this patent is extended or adjusted under 35 U.S.C. 154(b) by 3 days.

(21) Appl. No.: 18/719,006

(22) PCT Filed: Mar. 28, 2023

(86) PCT No.: PCT/CN2023/084307
§ 371 (c)(1),
(2) Date: Jun. 12, 2024

(87) PCT Pub. No.: WO2024/183109
PCT Pub. Date: Sep. 12, 2024

(65) Prior Publication Data
US 2025/0110072 A1   Apr. 3, 2025

(30) Foreign Application Priority Data

Mar. 6, 2023 (CN) .......................... 202310214056.6

(51) Int. Cl.
*G01N 27/12* (2006.01)
*C01G 19/02* (2006.01)

(52) U.S. Cl.
CPC ........... *G01N 27/125* (2013.01); *C01G 19/02* (2013.01); *C01P 2002/52* (2013.01);
(Continued)

(58) Field of Classification Search
CPC ... G01N 27/125; C01G 19/02; C01P 2002/52; C01P 2004/04; C01P 2004/16; C01P 2004/64
See application file for complete search history.

(56) References Cited

U.S. PATENT DOCUMENTS

| | | | | |
|---|---|---|---|---|
| 2016/0187279 A1* | 6/2016 | Tayebi | ............... | G01N 33/0031 73/31.06 |
| 2018/0003660 A1* | 1/2018 | Tayebi | ............... | G01N 33/0006 |

(Continued)

FOREIGN PATENT DOCUMENTS

| | | |
|---|---|---|
| CN | 110642288 A | 1/2020 |
| CN | 110988039 A | 4/2020 |

(Continued)

OTHER PUBLICATIONS

Inderan et al., Study of structural properties and defects of Ni-doped SnO2 nanorods as ethanol gas sensors, Nanotechnology, 2017, 28, 265702 (Year: 2017).*
(Continued)

*Primary Examiner* — Shizhi Qian
(74) *Attorney, Agent, or Firm* — OSTROLENK FABER LLP

(57) ABSTRACT

Disclosed are a doped colloidal metal oxide quantum wire and a preparation method thereof, a gas sensor, a gas sensor array, and use thereof, which relate to the technical field of gas sensors. In the preparation method, a main metal precursor, a doped metal precursor, an alcohol solvent, and a fatty acid surfactant are mixed, and a resulting mixture is subjected to a solvothermal reaction, to obtain the doped colloidal metal oxide quantum wire, wherein a main metal element in the main metal precursor is selected from Sn, Zn, W, In, Mo, Fe, Co, Ni, and Cu; a doped metal element in the doped metal precursor is selected from V, Nb, Ta, Cr, Mo, W, Mn, Fe, Co, Ni and Cu; the doped metal element is different
(Continued)

from the main metal element; and the solvothermal reaction is performed at a temperature of 150-300° C.

12 Claims, 30 Drawing Sheets

(52) U.S. Cl.
    CPC ...... *C01P 2004/04* (2013.01); *C01P 2004/16* (2013.01); *C01P 2004/64* (2013.01)

(56) References Cited

U.S. PATENT DOCUMENTS

| | | | |
|---|---|---|---|
| 2019/0277791 A1 | 9/2019 | Tripathy | |
| 2022/0067093 A1* | 3/2022 | Su | G01N 33/0001 |
| 2022/0349871 A1* | 11/2022 | Lee | G01N 27/128 |

FOREIGN PATENT DOCUMENTS

| | | |
|---|---|---|
| CN | 111650252 A | 9/2020 |
| CN | 113511682 A | 10/2021 |

OTHER PUBLICATIONS

Lin et al., The effect of Ni doping concentration on the gas sensing properties of Ni doped SnO2, Sensors and actuators B: Chemical, 2017, 239, 501-510 (Year: 2017).*
Ponzoni, Metal oxide chemiresistors: a structural and functional comparison between nanowires and nanoparticles, sensors, 2022, 22, 3351 (Year: 2022).*
Rzaij et al., A review on tin dioxide gas sensor: the role of the metal oxide doping, nanoparticles, and operating temperatures, World Journal of Advanced Research and Reviews, 2022, 14, 051-062 (Year: 2022).*
Chen et al., Highlights on advances in SnO2 quantum dots: insights into synthesis strategies, modifications and applications, Materials Research Letters, 2018, 6:9, 462-488 (Year: 2018).*
Xu et al., SnO2 quantum dots and quantum wires: controllable synthesis, self-assembled 2D architectures, and gas-sensing properties, JACS, 2008, 130, 12527-12535 (Year: 2008).*
Zhang et al., A miniaturized electronic nose with artificial neural network for anti-interference detection of mixed indoor hazardous gases, Sensors and Actuators B: Chemical, 2021, 326, 128822 (Year: 2021).*
CN Office Action issued in counterpart CN application No. 202310214056.6, mailed Dec. 27, 2023.
International Search Report issued in International Application No. PCT/CN2023/084307, mailed May 15, 2023.
Xiangxing Xu et al. "SnO2 Quantum Dots and Quantum Wires: Controllable Synthesis, Self-Assembled 2D Architectures, and Gas-Sensing Properties" J. Am. Chem. Soc., vol. 130, Issue 37, Aug. 21, 2008 (Aug. 21, 2008) ISSN:1520-5126; p. 12528, left column.
Graphene Oxide-Loaded SnO2 Quantum Wires with Sub4 Nanometer Diameters for Low-Temperature H2S Gas Sensing, Zhilong Song et al., "ACS Appl. Nano Mater.", vol. 3, pp. 6385-6393, Jun. 16, 2020).
Conductance analysis of (Co, Nb, Fe)-doped SnO2 thick film gas sensors, Miguel Adolfo Pont et al., "J Mater Sci: Mater Electron", vol. 18, pp. 1171-1177, Jun. 30, 2007).
Wireless Self-Powered High-Performance Integrated Nanostructured-Gas-Sensor Network for Future Smart Homes, Zhilong Song et al., "ACS Nano", vol. 15, pp. 7659-7667, Apr. 19, 2021).
Decision to grant a CN application No. 202310214056.6 mailed Dec. 27, 2023.

* cited by examiner

A)

B)

DOPED COLLOIDAL METAL OXIDE QUANTUM WIRE AND PREPARATION METHOD THEREOF, GAS SENSOR, GAS SENSOR ARRAY AND USE THEREOF

CROSS REFERENCE TO RELATED APPLICATION

The present application is a national stage application of International Patent Application No. PCT/CN2023/084307, filed on Mar. 28, 2023, which claims priority to Chinese Patent Application No. 202310214056.6, entitled "Doped Colloidal Metal Oxide Quantum Wire and Preparation Method thereof, Gas Sensor, Gas Sensor Array, and Use thereof", and filed with the China National Intellectual Property Administration on Mar. 6, 2023. The disclosure of the two applications is incorporated by references herein in their entireties as part of the present application.

TECHNICAL FIELD

The present disclosure relates to the technical field of gas sensors, particularly to a doped colloidal metal oxide quantum wire and a preparation method thereof, a gas sensor, a gas sensor array, and use thereof.

BACKGROUND

Gas sensors have the ability to perceive the surrounding environment, including the detection of chemical analytes, exhaled gases, flammable and explosive gases, as well as gas leakage detection, environmental monitoring, and disease diagnosis. They play a crucial role in our daily lives. With the development of Internet technology, intelligent, low-power and highly integrated gas sensors become more and more popular. High performance (high sensitivity, high selectivity, and portability) has always been the pursuing goal of gas sensors.

Among them, sensors based on metal oxide semiconductors (MOS), especially $SnO_2$-based resistive gas sensors, have been proven to be suitable materials and have been widely used in the market due to their easiness in manufacturing, simple operations, and low production costs. However, traditional semiconductor resistive gas sensors have some problems: 1) high operation temperature: heating (usually 200-500° C.) is required to activate the adsorption capacity to the target gas and improve the response sensitivity to gas. This means that: gas sensors are faced with high power consumption, long-term stability, and service life thereof are challenged, as well as serious obstacles to the integration, miniaturization, and development of portable intelligent sensors; 2) high lower detection limit: traditional gas sensors generally have a lower detection limit at ppm (parts-per-million) level, while the actual gas concentration in the environment is usually at ppb (parts-per-billion) level, which could not meet the low concentration gas detection requirement in actual environments; 3) there is a problem of common sensitivity, making it difficult to achieve selective identification of target gases.

SUMMARY

In view of this, the present disclosure aims to provide a doped colloidal metal oxide quantum wire and a preparation method thereof, a gas sensor, a gas sensor array and use thereof. The gas sensor composed of the doped colloidal metal oxide quantum wires prepared in the present disclosure has a low operating temperature and a lower detection limit for a gas reaching ppb level. The as-constructed gas sensor array could achieve selective recognition and detection of multiple gases.

In order to achieve the above-mentioned objectives, the present disclosure provides the following technical solutions.

Provided is a method for preparing a doped colloidal metal oxide quantum wire, including:

mixing a main metal precursor, a doped metal precursor, an alcohol solvent, and a fatty acid surfactant, and subjecting a resulting mixture to a solvothermal reaction to obtain the doped colloidal metal oxide quantum wire, wherein a main metal element in the main metal precursor is one selected from the group consisting of Sn, Zn, W, In, Mo, Fe, Co, Ni, and Cu;

a doped metal element in the doped metal precursor is at least one selected from the group consisting of V, Nb, Ta, Cr, Mo, W, Mn, Fe, Co, Ni and Cu;

the doped metal element is different from the main metal element; and the solvothermal reaction is performed at a temperature of 150-300° C.

In some embodiments, the main metal precursor is a chloride of the main metal element, and the doped metal precursor is a chloride of the doped metal element.

In some embodiments, a molar ratio of the doped metal element in the doped metal precursor to the main metal element in the main metal precursor is in a range of 1:100 to 1:20.

In some embodiments, the alcohol solvent includes at least one selected from the group consisting of methanol, ethanol, and butanol; and a ratio of a sum of masses of the main metal precursor and the doped metal precursor to a mass of the alcohol solvent is in a range of 1:10 to 1:100.

In some embodiments, the fatty acid surfactant has 8 or more carbon atoms, and a mass ratio of the fatty acid surfactant to the alcohol solvent is in a range of 1:4 to 1:1.

In some embodiments, the solvothermal reaction is performed for 3-24 h.

The present disclosure provides a doped colloidal metal oxide quantum wire prepared by the method as described in the above technical solutions, wherein a metal element of a metal oxide in the doped colloidal metal oxide quantum wire includes the main metal element and the doped metal element, and wherein the main metal element is one selected from the group consisting of Sn, Zn, W, In, Mo, Fe, Co, Ni, and Cu; the doped metal element is at least one selected from the group consisting of V, Nb, Ta, Cr, Mo, W, Mn, Fe, Co, Ni, and Cu; the doped metal element is different from the main metal element; and the doped colloidal metal oxide quantum wire has a diameter of 1-10 nm.

The present disclosure provides a gas sensor, including
a substrate with a sensing electrode deposited thereon, and
a gas-sensitive material, being composited onto a surface of a side of the substrate where the sensing electrode is deposited,
wherein the gas-sensitive material is the doped colloidal metal oxide quantum wire as described in the above technical solutions.

The present disclosure provides a gas sensor array, including a plurality of gas sensors, wherein the gas sensors include the gas sensor as described in the above technical solutions.

The present disclosure provides use of the gas sensor array as described in the above technical solutions in selective recognition of a gas, wherein the gas includes at least one selected from the group consisting of $H_2S$, formaldehyde, acetone, CO, $CH_4$, $H_2$, toluene, and isobutene.

The present disclosure provides a method for preparing a doped colloidal metal oxide quantum wire, including: mixing a main metal precursor, a doped metal precursor, an alcohol solvent, and a fatty acid surfactant, and subjecting a resulting mixture to a solvothermal reaction to obtain the doped colloidal metal oxide quantum wire, wherein a main metal element in the main metal precursor is one selected from the group consisting of Sn, Zn, W, In, Mo, Fe, Co, Ni, and Cu; a doped metal element in the doped metal precursor is at least one selected from the group consisting of V, Nb, Ta, Cr, Mo, W, Mn, Fe, Co, Ni and Cu; the doped metal element is different from the main metal element; and the solvothermal reaction is performed at a temperature of 150-300° C. The present disclosure adopts a solvent thermal method (colloid synthesis method) to prepare a doped colloidal metal oxide quantum wire. The colloidal metal oxide quantum wires have a diameter of 1-10 nm. Compared with traditional micrometer scale metal oxide gas-sensitive materials, colloidal metal oxide quantum wires with a smaller size have a larger specific surface area and more exposed sites, which could effectively enhance the interaction force with gas molecules, thereby improving the gas-sensitive performance. In the present disclosure, one or more of V, Nb, Ta, Cr, Mo, W, Mn, Fe, Co, Ni, and Cu are introduced as doping atoms by doping metal precursors. This not only regulates the morphology and structure of quantum wires, but also enhances the interaction between their exposed sites and gas molecules, significantly improving the gas-sensitive response performance. Moreover, the doped atoms have the ability to adsorb water, which weakens the influence of water molecules on the performance of quantum wires and makes them resistant to humidity interference.

The present disclosure provides a gas sensor, including a substrate with a sensing electrode deposited thereon, and a gas-sensitive material, being composited onto a surface of a side of the substrate where the sensing electrode is deposited, wherein the gas-sensitive material is the doped colloidal metal oxide quantum wire as described in the above technical solutions. In the present disclosure, due to the smaller size of the doped colloidal metal oxide quantum wire and the doping of elements such as V, Nb, Ta, the gas sensor composed of the doped colloidal metal oxide quantum wire as a gas-sensitive material has a greater activity, which significantly enhances the gas-sensitive response performance. Therefore, the gas sensor could effectively lower down the operation temperature, even at room temperature, and have a lower detection limit for a gas reaching ppb level. In addition, the gas sensor has the ability to resist humidity. Results of examples show that the gas sensor according to the present disclosure still has gas detection capability in high humidity environments (RH=90%), with the lower detection limits of 2 ppb, 2 ppb, and 4 ppb for $H_2S$, formaldehyde, and acetone, respectively, making it the best reported room temperature gas sensor.

The present disclosure provides a gas sensor array including a plurality of gas sensors, wherein the gas sensors include the gas sensor as described in the above technical solutions. A single gas sensor could not achieve selective recognition of a target gas. In the present disclosure, gas sensors composed of doped colloidal metal oxide quantum wires as gas-sensitive materials are assembled into a gas sensor array, which could achieve selective recognition and detection of multiple gases.

BRIEF DESCRIPTION OF THE DRAWINGS

FIG. 3A to FIG. 3F show results of the room-temperature gas sensitivity performance test of the $Ta/SnO_2$ gas sensor prepared in Example 2, in which, FIG. 3A to FIG. 3C show resistance signal changes of the $Ta/SnO_2$ gas sensor in response to different concentrations (20-1000 ppb) of $H_2S$, formaldehyde, and acetone gas at different humidity levels (RH=30%, 60%, 90%); FIG. 3D to FIG. 3F show the lowest detection limit of the $Ta/SnO_2$ gas sensor for three gases at a relative humidity of 90%.

FIG. 4A to FIG. 4C show the diagrams of the room-temperature gas sensitivity performance test of the $Nb/SnO_2$ gas sensor prepared in Example 2, in which, FIG. 4A to FIG. 4C show resistance signal changes of the $Nb/SnO_2$ gas sensor in response to different concentrations (20-1000 ppb) of $H_2S$, formaldehyde, and acetone gas at different humidity levels (RH=30%, 60%, 90%).

FIG. 5A to FIG. 5C show the diagrams of the room-temperature gas sensitivity performance test of the $V/SnO_2$ gas sensor prepared in Example 2, in which, FIG. 5A to FIG. 5C show resistance signal changes of the $V/SnO_2$ gas sensor in response to different concentrations (20-1000 ppb) of $H_2S$, formaldehyde, and acetone gas at different humidity levels (RH=30%, 60%, 90%).

FIG. 6A to FIG. 6I show the diagrams of response sensitivity of four gas sensors prepared in Example 3 when being in response to different concentrations of $H_2S$, formaldehyde, and acetone gas at different humidity levels, in which, FIG. 6A to FIG. 6C show the diagrams of response sensitivity of the four gas sensors when being in response to different concentrations of (20-1000 ppb) $H_2S$ at different humidity levels; FIG. 6D to FIG. 6F show the diagrams of response sensitivity of the four gas sensors when being in response to different concentrations of (20-1000 ppb) formaldehyde at different humidity levels; and FIG. 6G to FIG. 6I show the diagrams of response sensitivity of the four gas sensors when being in response to different concentrations of (20-1000 ppb) acetone at different humidity levels.

DETAILED DESCRIPTION OF THE EMBODIMENTS

Figure 1A:
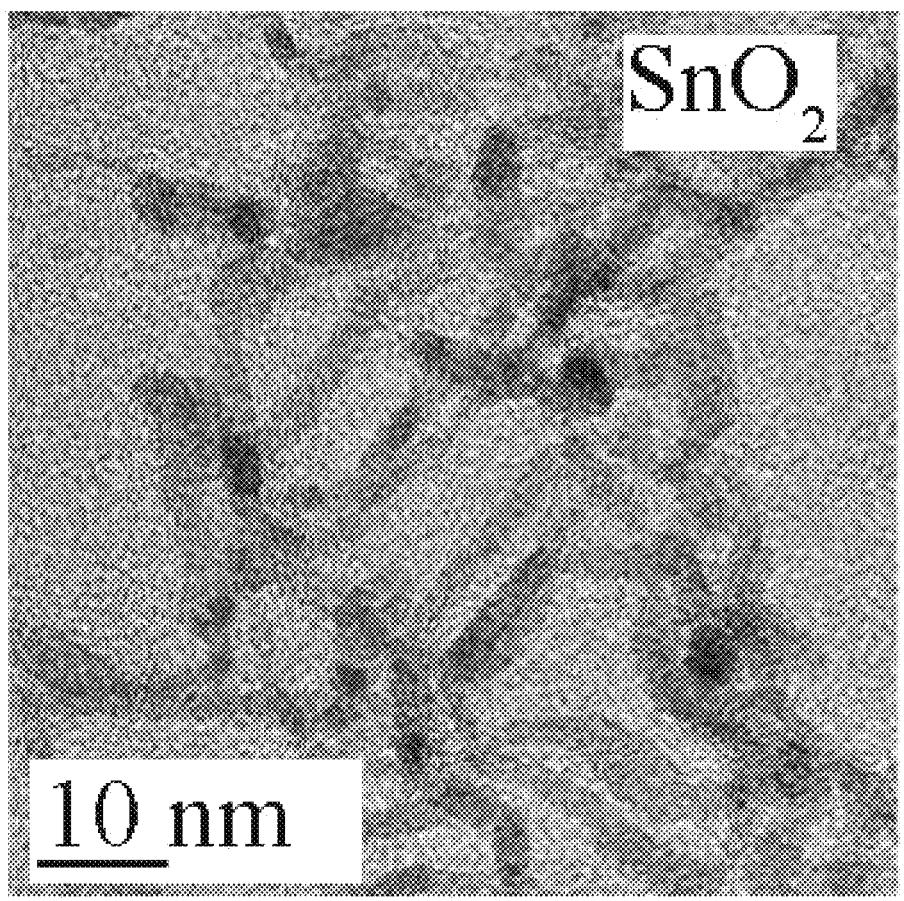
FIG. 1A to FIG. 1D show transmission electron microscope images of $V/SnO_2$, $Nb/SnO_2$, $Ta/SnO_2$ colloidal quantum wires, and undoped $SnO_2$ colloidal quantum wires prepared in Example 1.
Figure 1B:
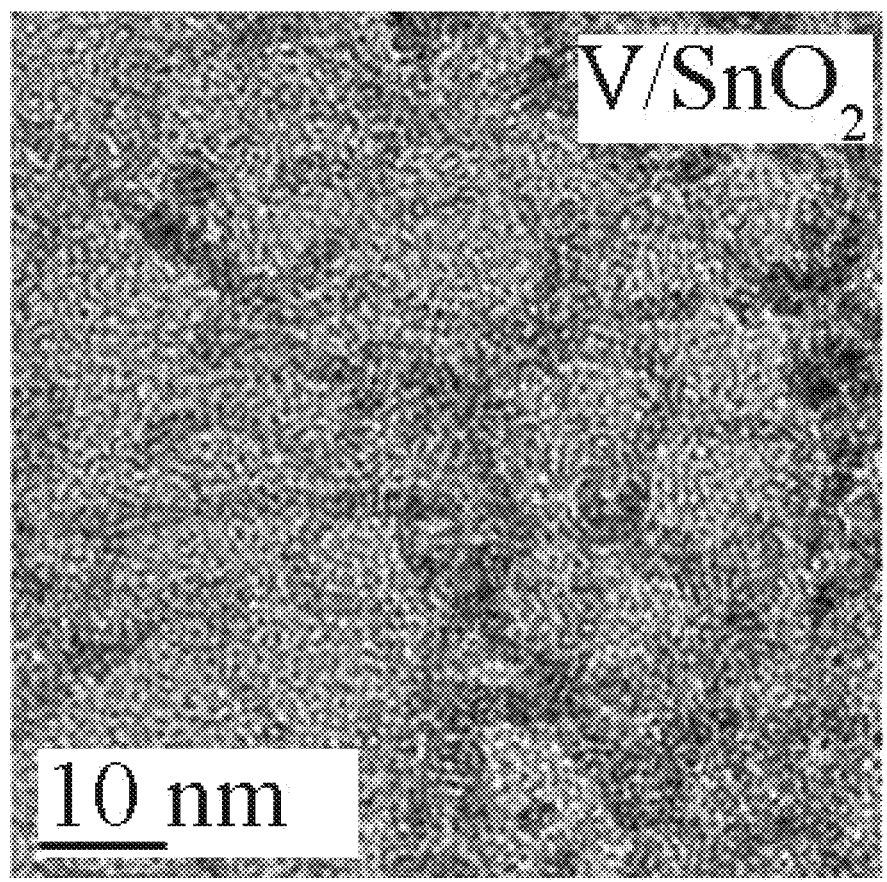
Figure 1C:
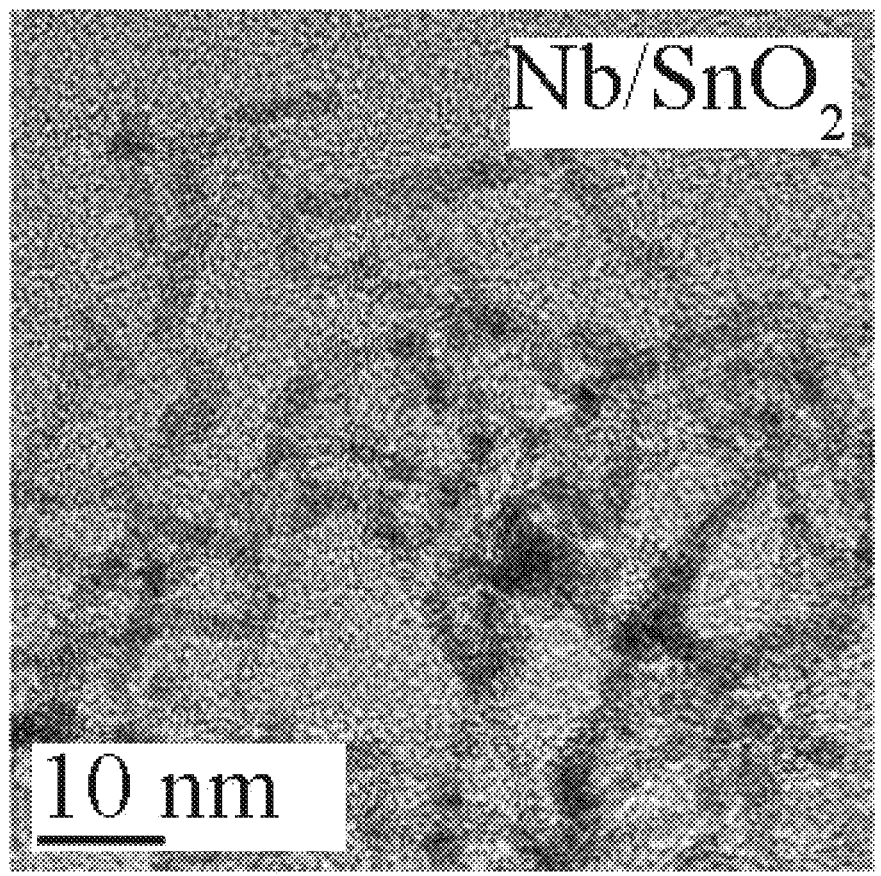
Figure 1D:
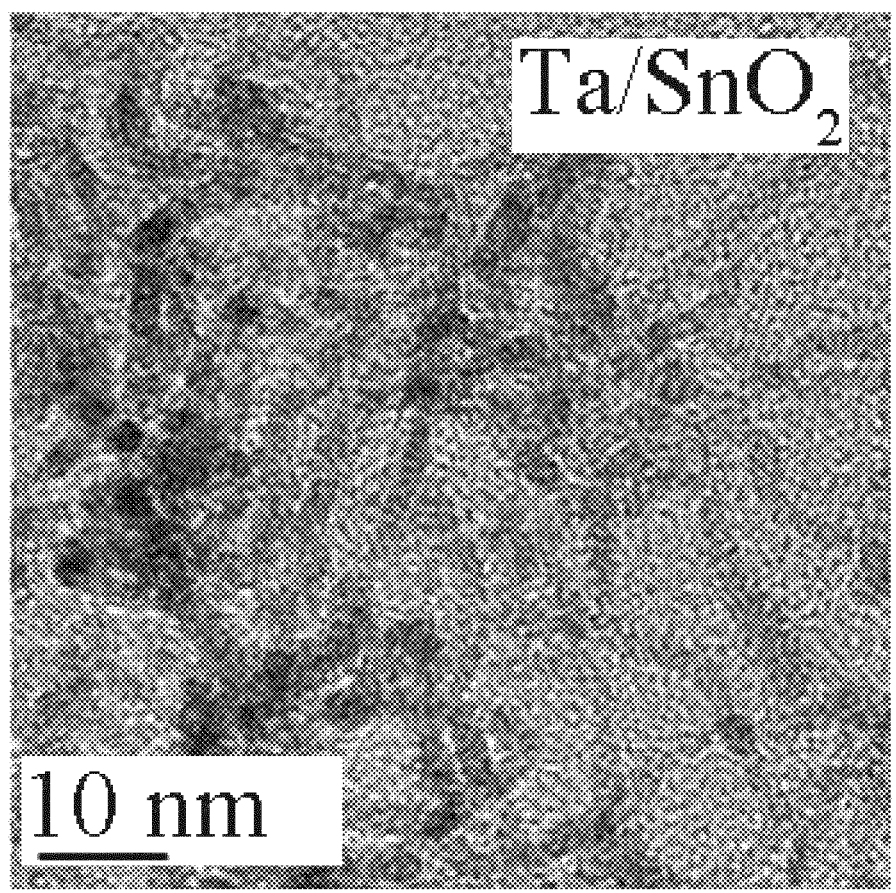

The present disclosure provides a method for preparing a doped colloidal metal oxide quantum wire, including:
    mixing a main metal precursor, a doped metal precursor, an alcohol solvent, and a fatty acid surfactant, and subjecting a resulting mixture to a solvothermal reaction, to obtain the doped colloidal metal oxide quantum wire, wherein a main metal element in the main metal precursor is one selected from the group consisting of Sn, Zn, W, In, Mo, Fe, Co, Ni, and Cu;

a doped metal element in the doped metal precursor is at least one selected from the group consisting of V, Nb, Ta, Cr, Mo, W, Mn, Fe, Co, Ni and Cu;

the doped metal element is different from the main metal element; and the solvothermal reaction is performed at a temperature of 150-300° C.

In the present disclosure, unless otherwise specified, all the raw materials involved are well-known commercially available goods to those skilled in the art.

In the present disclosure, the main metal element in the main metal precursor is one selected from the group consisting of Sn, Zn, W, In, Mo, Fe, Co, Ni and Cu, and preferably is Sn, Zn or W. In some embodiments, the main metal precursor is a chloride of the main metal element. In the present disclosure, the doped metal element in the doped metal precursor is at least one selected from the group consisting of V, Nb, Ta, Cr, Mo, W, Mn, Fe, Co, Ni, and Cu, and preferably is V, Nb or Ta. In some embodiments, the doped metal precursor is a chloride of the doped metal element. In some embodiments of the present disclosure, a molar ratio of the doped metal element in the doped metal precursor to the main metal element in the main metal precursor is in a range of 1:100 to 1:20, and preferably 1:50 to 1:25. In some embodiments, under the condition that the doped metal element in the doped metal precursor is a mixture of several metal elements, there is no special requirement for their mixing ratio in the present disclosure, as long as the molar ratio of the doped metal element in the doped metal precursor to the main metal element in the main metal precursor meets the requirement. In some embodiments of the present disclosure, the alcohol solvent includes one or more of methanol, ethanol, and butanol. In some embodiments, a ratio of a sum of masses of the main metal precursor and the doped metal precursor to the mass of the alcohol solvent is in a range of 1:10 to 1:100. In some embodiments of the present disclosure, the fatty acid surfactant has 8 or more, preferably 8-18 carbon atoms, such as octanoic acid (C8), decanoic acid (C10), and oleic acid (C18). In some embodiments, a mass ratio of the fatty acid surfactant to the alcohol solvent is in a range of 1:4 to 1:1, and preferably 1:2 to 1:1. In some embodiments of the present disclosure, the mixing is performed by ultrasonic mixing, and there are no special requirements for the conditions of ultrasonic mixing in the present disclosure, as long as each component is mixed to be uniform. In some embodiments of the present disclosure, the solvothermal reaction is performed at a temperature of 150-300° C., preferably 150-200° C. In some embodiments, the solvothermal reaction is performed for 3-24 hours, and preferably 3-12 hours. Taking the main metal element Sn as an example, in the solvothermal reaction process, initially, the main metal element Sn and the doped metal element M (M=V, Nb, Ta, etc.) coordinate with the fatty acid surfactant to form a metal complex. As the temperature increases, the complexes of the main metal element Sn first form clusters of $Sn(OH)_4$ under the action of the alcohol solvent. As the reaction time prolongs, the doped metal element M partially replaces the main metal element Sn, forming the doped intermediate $M_xSn_{1-x}(OH)_4$. Finally, the clusters are connected point-to-point to form wires and dehydrated to form doped colloidal metal oxide quantum wires. The reason for the formation of the colloidal morphology lies in that the surface of the quantum wire contains a small amount of covered fatty acid ligands.

The present disclosure provides a doped colloidal metal oxide quantum wire prepared by the method as described in the above technical solutions, wherein a metal element of a metal oxide in the doped colloidal metal oxide quantum wire includes the main metal element and the doped metal element, and wherein the main metal element is one selected from the group consisting of Sn, Zn, W, In, Mo, Fe, Co, Ni, and Cu; the doped metal element is at least one selected from the group consisting of V, Nb, Ta, Cr, Mo, W, Mn, Fe, Co, Ni, and Cu; the doped metal element is different from the main metal element; and the doped colloidal metal oxide quantum wire has a diameter of 1-10 nm. In the present disclosure, the doped colloidal metal oxide quantum wire could be effectively dispersed in a polar solvent (such as toluene, chloroform), has good compatibility with various substrates, and is easy to form a film. In the present disclosure, the doped colloidal metal oxide quantum wire has a smaller size, which provides the colloidal metal oxide quantum wire having a larger specific surface area and more exposed sites, thereby effectively enhancing the interaction force with gas molecules and enhancing the gas-sensitive performance. Not only the doped metal atoms could regulate the morphology and structure of the quantum wires, but also the exposed sites resulted therefrom could enhance the interaction with gas molecules, thereby significantly enhancing the gas-sensitive response performance.

The present disclosure provides a gas sensor, which includes a substrate with a sensing electrode deposited thereon, and a gas-sensitive material, being composited onto a surface of a side of the substrate where the sensing electrode is deposited, wherein the gas-sensitive material is the doped colloidal metal oxide quantum wire as described in the above technical solutions. In some embodiments of the present disclosure, the substrate is a rigid substrate, such as an alumina ceramic, or is a flexible substrate, such as polyethylene terephthalate (PET), and there are no special requirements for this in the present disclosure. In some embodiments of the present disclosure, the sensing electrode is an Au electrode. In some embodiments, the sensing electrode has a thickness of 100 nm, and the sensing electrode is used to transmit electrical signals from the sensor. In some embodiments of the present disclosure, the sensing electrode is deposited onto the substrate by magnetic sputtering, and the sensing electrode could also be patterned. There is no special limitation on the specific shape of the patterned electrode in the present disclosure, which may be an interdigital electrode or other patterned electrodes that are conducive to electrical signal output. In the present disclosure, based on the characteristic that the doped colloidal metal oxide quantum wire could be effectively dispersed in a polar solvent such as toluene and chloroform, it is dissolved in a polar solvent to form a solution, and the doped colloidal metal oxide quantum wire is applied in solution form by spraying, droplet coating, or inkjet printing onto a surface of a side of the substrate where the sensing electrode is deposited, thereby achieving the composite between the doped colloidal metal oxide quantum wire and the substrate with the sensing electrode deposited thereon. The gas sensor according to the present disclosure adopts the doped colloidal metal oxide quantum wire as the gas-sensitive material, which has the greater activity and the significantly enhanced gas-sensitive response performance. Therefore, it could effectively reduce the operation temperature of the gas sensor, even allow the gas sensor to be operated at room temperature, and realize ppb level of lower detection limit for a gas.

The present disclosure also provides a gas sensor array, including a plurality of gas sensors, wherein the gas sensor includes the gas sensor as described in the above technical solutions. In the present disclosure, gas sensors composed of colloidal metal oxide quantum wires of different doping types are randomly combined and assembled into a gas sensor array. In some embodiments, the gas sensors in the gas sensor array are connected in parallel. In some embodiments, the gas sensor array is in a form of A×B, wherein A≥2 and B≥2. In some specific embodiments, the gas sensor array is a 2×2 sensor array or a larger array combination (such as 4×4, 10×10, 100×100); the combination principle in the gas sensor array is that any gas sensors with different response sensitivities could be randomly combined into an array based on the fact that different metal elements have different adsorption abilities for different gases and thus different response values for different gases because of their different outermost electron arrangements. That is to say, each gas sensor in the array has its own characteristics in terms of response to gases (i.e., difference in response sensitivity). In some embodiments, response sensitivity difference between gas sensors in a gas sensor array for a certain gas is ≥1%. If there are many types of gases to distinguish, a larger combination of array sensors is needed. In the embodiments of the present disclosure, the sensor in the gas sensor array further includes a gas sensor composed of undoped colloidal metal oxide quantum wires (i.e., the addition of doped metal precursor(s) is omitted during the quantum wire preparation). In the present disclosure, the gas sensor array could achieve selective recognition of multiple types of gases, which is conducive to the recognition of target gases in practical complex environments and expands its development in the field of exhaled gas detection.

The present disclosure provides use of the gas sensor array as described in the above technical solutions in gas selective recognition, wherein the gas includes one or more of $H_2S$, formaldehyde, acetone, CO, $CH_4$, $H_2$, toluene, and isobutene. In some embodiments of the present disclosure, the use is performed as follows: testing the response sensitivity of the sensor array to different concentrations of gases such as $H_2S$, formaldehyde, and acetone at different humidity levels, and establishing a response sensitivity database of gas sensors to different gases; performing principal component analysis (PCA) on the sensitivity data of gas sensors in the database to different gases, thereby achieving independent differentiation of sensor arrays for gases such as $H_2S$, formaldehyde, and acetone, with each gas having its own region; analyzing the obtained response sensitivity data using pattern algorithms under the condition that an unknown gas to be tested enters the gas sensor array and response starts; classifying the unknown gas to be tested based on the analysis results, and identifying what type the target gas is after entering a specific area. In some embodiments of the present disclosure, the principal component analysis (PCA) is performed as follows: 1) standardizing indicator data (such as response sensitivity) (automatically executed by Python software); 2) performing correlation judgment between indicators; 3) determining a formula of a principal component; and 4) naming the principal component. In some embodiments, the pattern algorithm analysis is performed as follows: 1) collecting data and conducting correlation analysis of indicators; 2) normalizing the data; 3) dividing the data into a training set and a testing set using sample data; 4) converting the data into formats supported by the software; 5) selecting a kernel function; 6) selecting the optimal parameters for the training set using cross validation, and obtaining a model. The present disclosure assembles gas sensors composed of colloidal metal oxide quantum wires of different doping types into an array, and combines pattern algorithms to achieve selective recognition and detection of multiple gases.

The following provides a detailed illustration of the doped colloidal metal oxide quantum wire and preparation method thereof, a gas sensor and a gas sensor array, and use thereof, in conjunction with examples. However, they shall not be construed as limiting the scope of the present disclosure.

Example 1

Doped colloidal metal oxide quantum wires were prepared according to the following procedures.

Butanol was used as the organic solvent (20 mL), $VCl_3$, $NbCl_5$, and $TaCl_5$ were used as doping element precursors (0.01 mmol), $SnCl_4$ was used as the main element precursor (1 mmol), and octanoic acid was used as the surfactant (10 mL). They were ultrasonically mixed to be uniform, and the resulting mixture was then subjected to reaction by solvothermal process at 150° C. for 3 hours, obtaining colloidal $SnO_2$ quantum wires doped with different elements, labeled as $V/SnO_2$, $Nb/SnO_2$, and $Ta/SnO_2$ colloidal quantum wires, respectively.

The $V/SnO_2$, $Nb/SnO_2$, and $Ta/SnO_2$ colloidal quantum wires could be effectively dispersed in polar solvent toluene, exhibiting the Tindall effect.

FIG. 1A to FIG. 1D show the transmission electron microscopy images of $V/SnO_2$, $Nb/SnO_2$, and $Ta/SnO_2$ colloidal quantum wires prepared in Example 1, and a comparison with the undoped $SnO_2$ colloidal quantum wires. As shown in FIG. 1A to FIG. 1D, $V/SnO_2$, $Nb/SnO_2$, and $Ta/SnO_2$ colloidal quantum wires, and $SnO_2$ colloidal quantum wires having a diameter of about 2 nm can be observed. After doping, the doped colloidal quantum wires have a decreased diameter, because the doped atoms adsorbed on the surface of $SnO_2$ enhance the confinement growth of the quantum wires.

Example 2

Figure 2A:
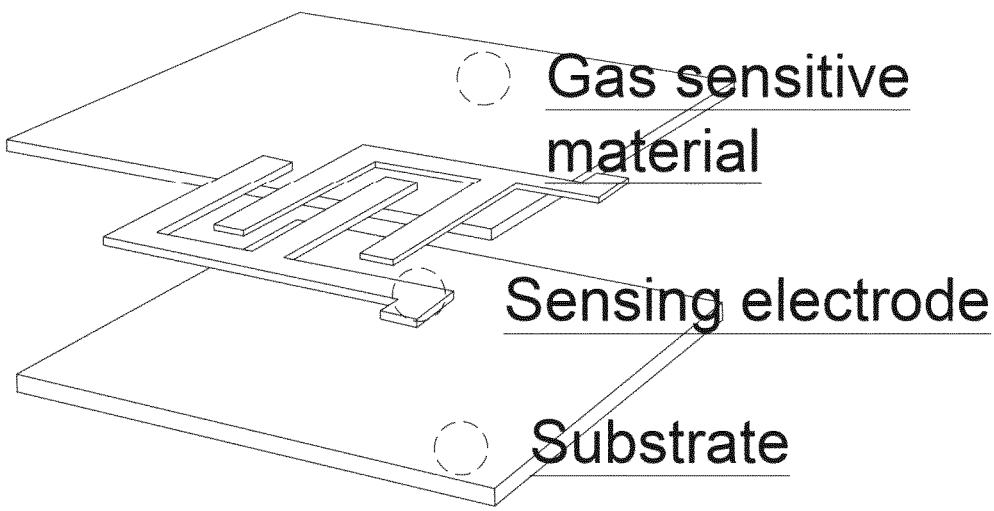
FIG. 2A to FIG. 2C show schematic diagrams of a single sensor, a 2×2 sensor array, and a 4×4 sensor array, in which, FIG. 2A, FIG. 2B, and FIG. 2C correspond to the single sensor, the 2×2 sensor array, and the 4×4 sensor array, respectively.
Figure 2B:
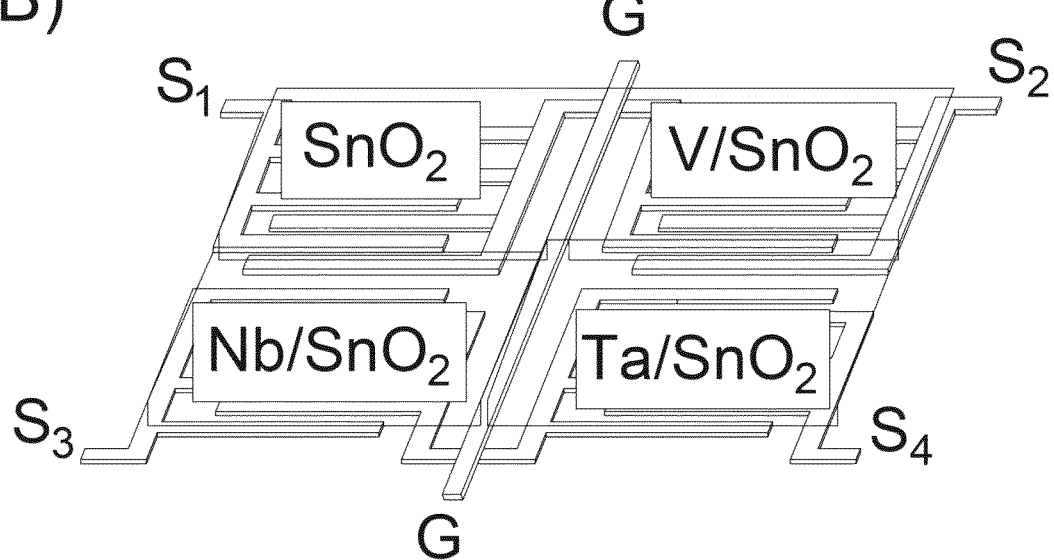
Figure 2C:
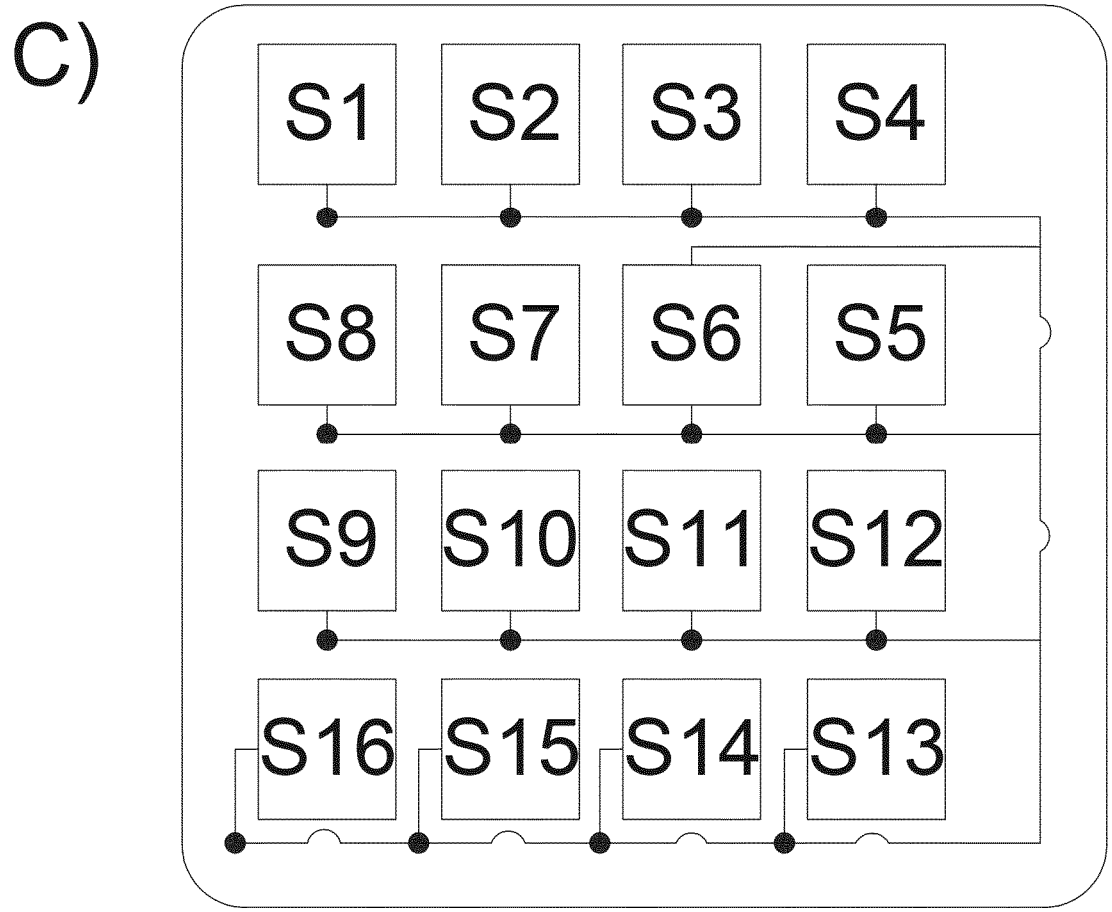

A gas sensor having a structure as shown in (A) of FIG. 2A to FIG. 2C, had a rigid alumina ceramic substrate. Patterned 100 nm Au interdigital electrodes were deposited on the substrate by magnetic sputtering as sensing electrodes for transmitting electrical signals of the sensor. Based on the solution-processable property of colloidal quantum wires, the $V/SnO_2$, $Nb/SnO_2$, $Ta/SnO_2$ colloidal quantum wires prepared in Example 1 and undoped $SnO_2$ colloidal quantum wires were applied onto a substrate with sensing electrodes by spraying, drop coating, or inkjet printing methods, obtaining gas sensors, labeled as a $V/SnO_2$ gas sensor, a $Nb/SnO_2$ gas sensor, a $Ta/SnO_2$ gas sensor, and a $SnO_2$ gas sensor.

Figure 3A:
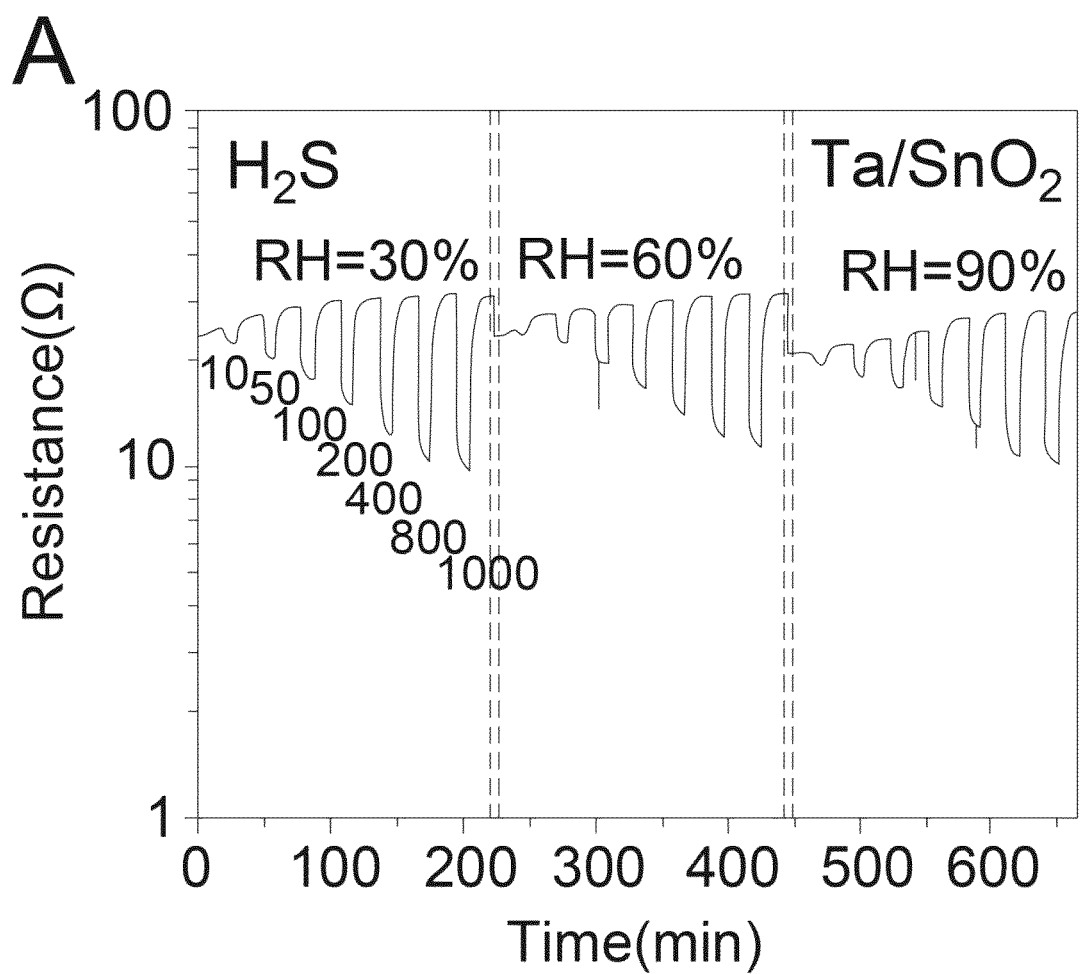
Figure 3B:
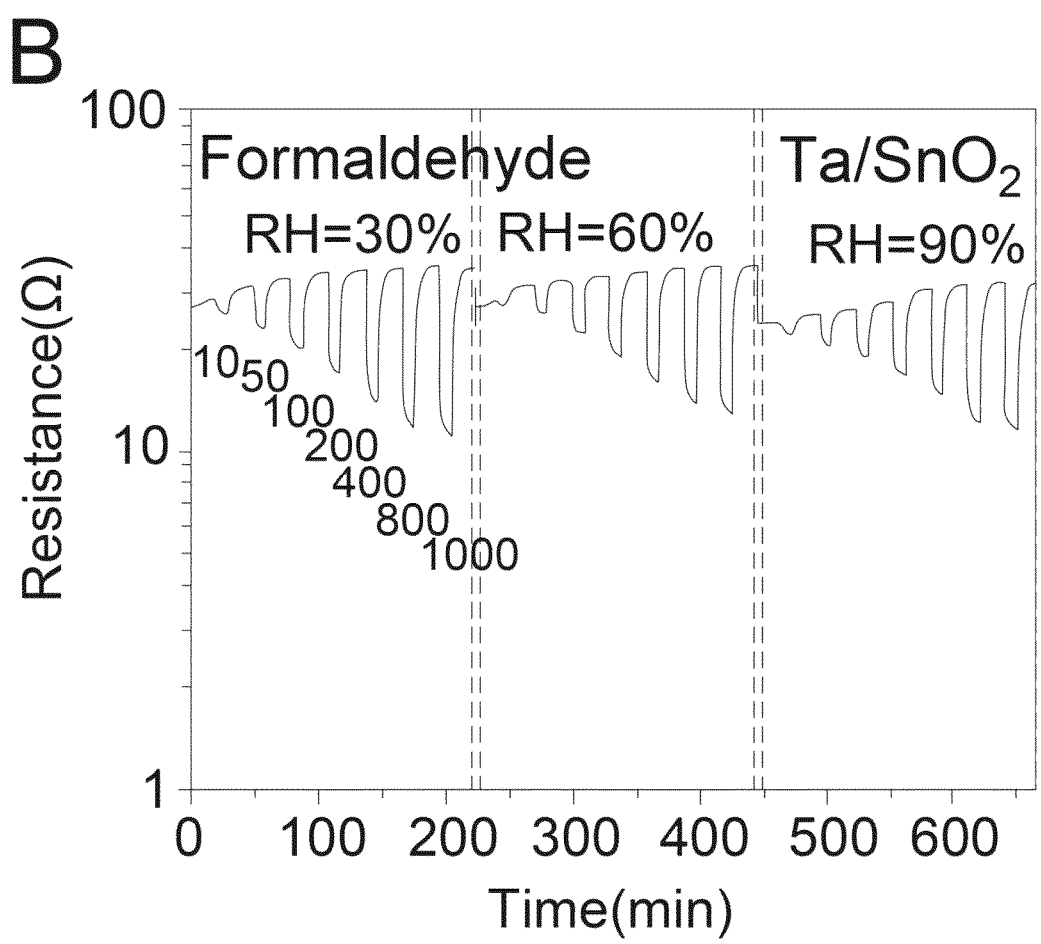
Figure 3C:
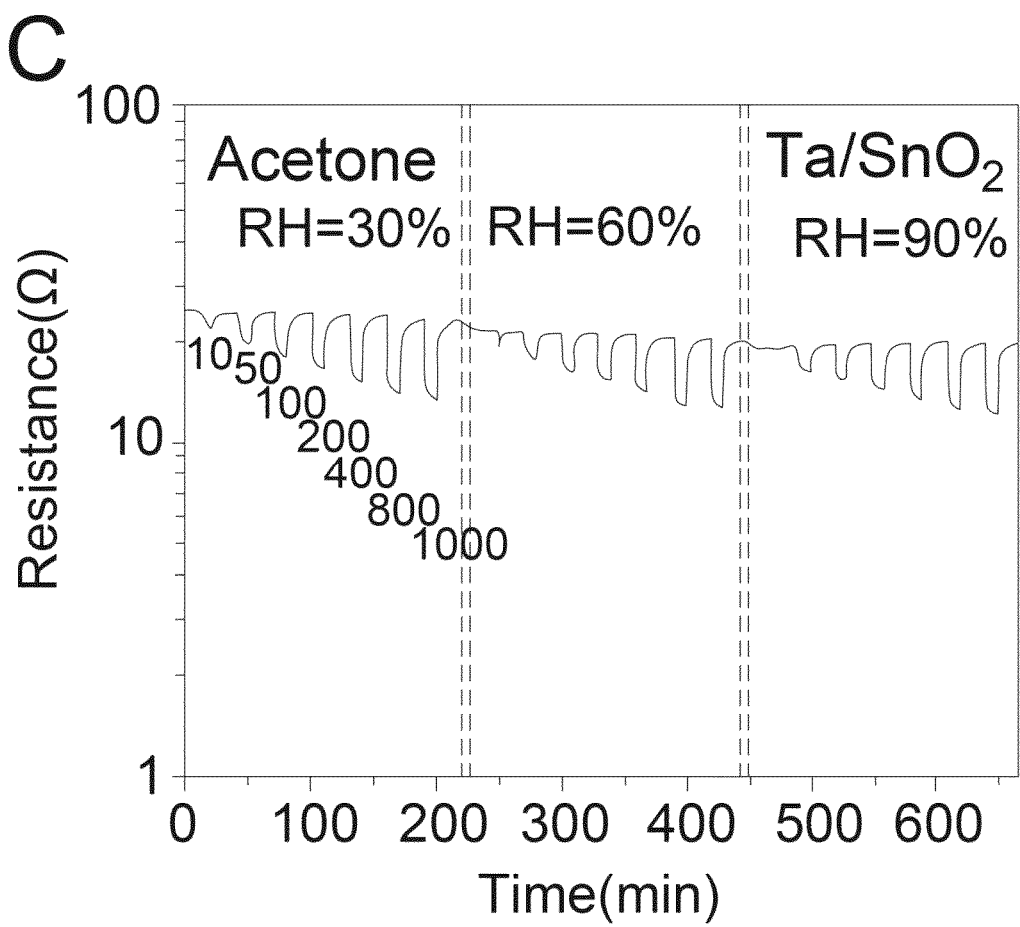
Figure 3D:
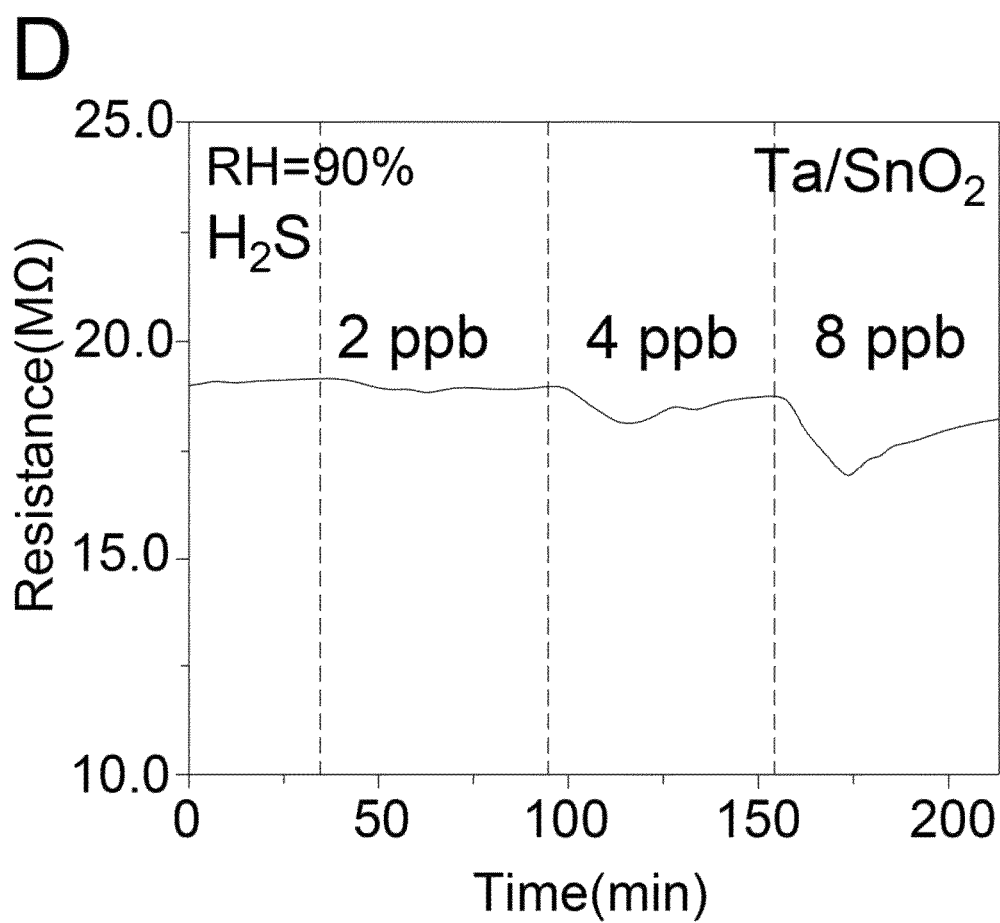
Figure 3E:
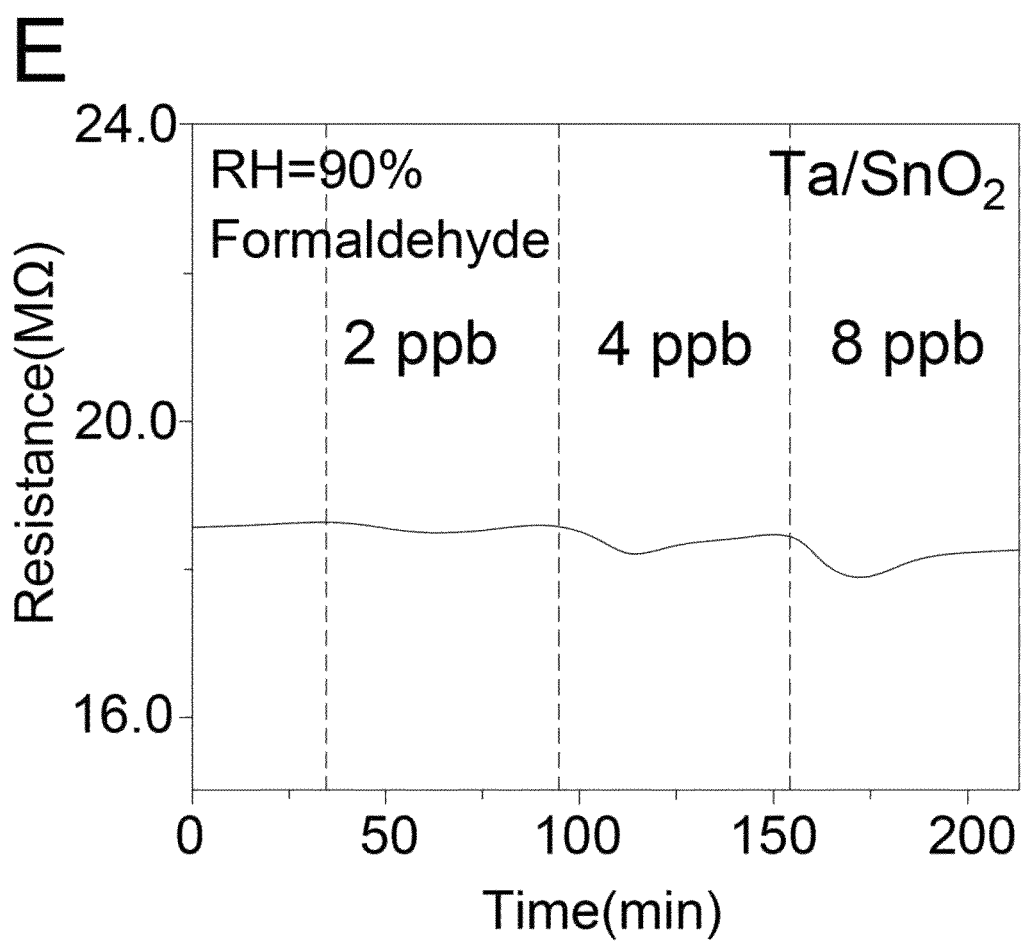
Figure 3F:
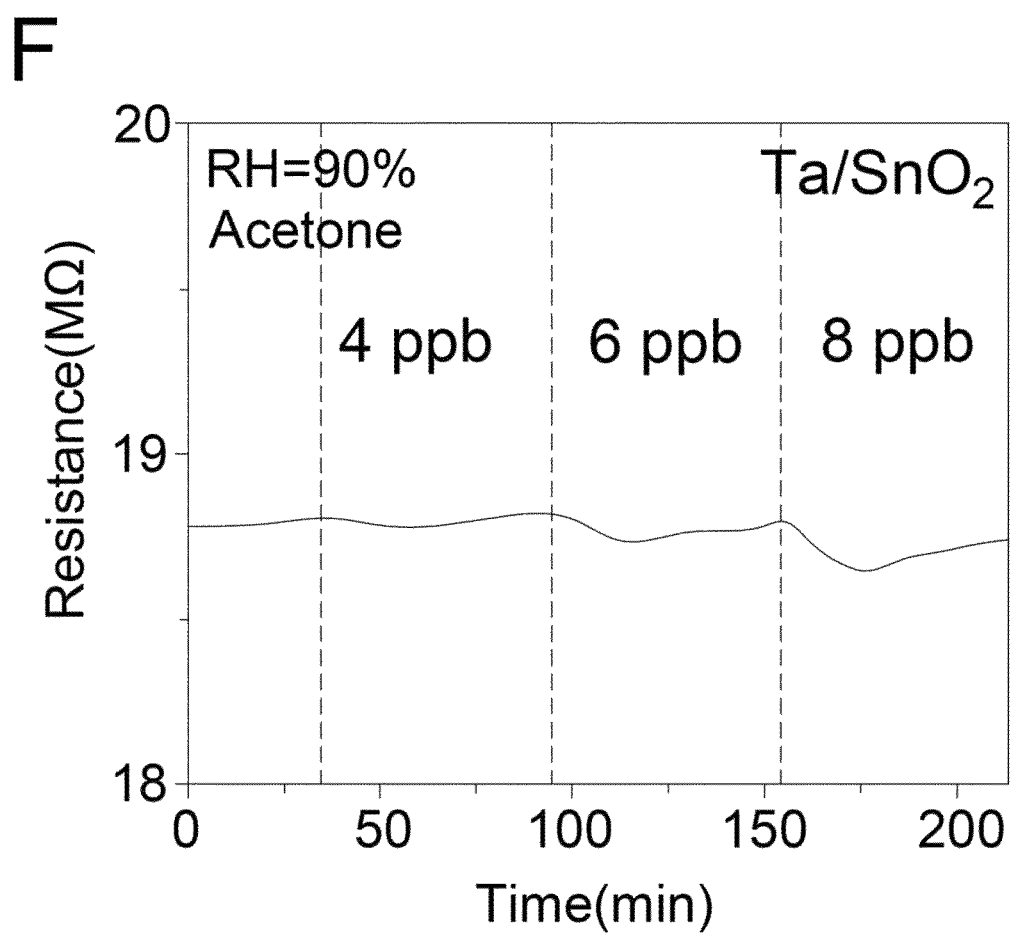

Room temperature gas-sensitive performance test was conducted on the $Ta/SnO_2$ gas sensor. The test results are shown in FIG. 3A to FIG. 3F, wherein FIG. 3A to FIG. 3C show the resistance signal changes of the $Ta/SnO_2$ gas sensor in response to different concentrations (10-1000 ppb) of $H_2S$, formaldehyde, and acetone gas at different humidity levels (RH-30%, 60%, 90%); and FIG. 3D to FIG. 3F show the lowest detection limits of the $Ta/SnO_2$ gas sensor for three gases at a relative humidity of 90%. As can be seen from FIG. 3A to FIG. 3F, the $Ta/SnO_2$ gas sensor responds to all three gases under different humidity conditions, with detection limits as low as ppb level. This gas sensor still has gas detection capability in high humidity environments, with lower detection limits for $H_2S$, formaldehyde, and acetone being 2 ppb, 2 ppb, and 4 ppb, respectively. It is the best currently-reported room temperature gas sensor.

Figure 4A:
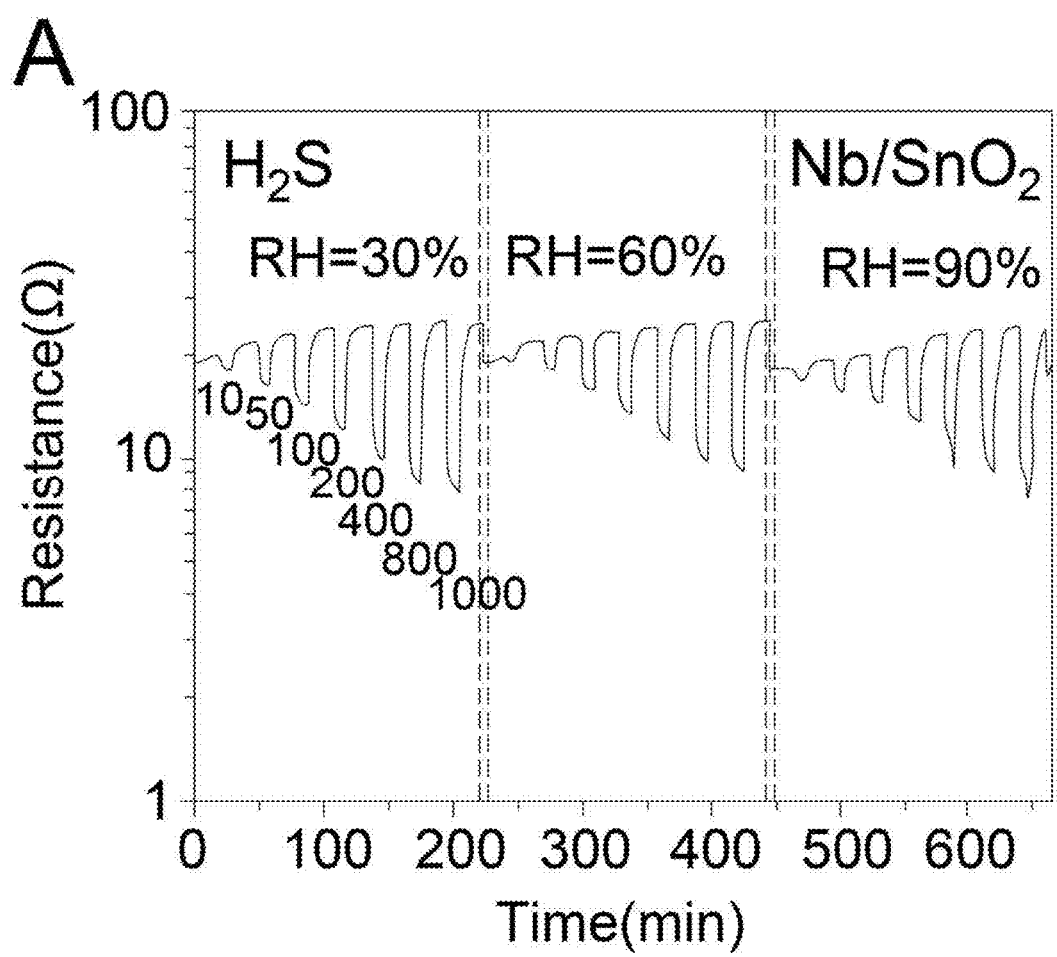
Figure 4B:
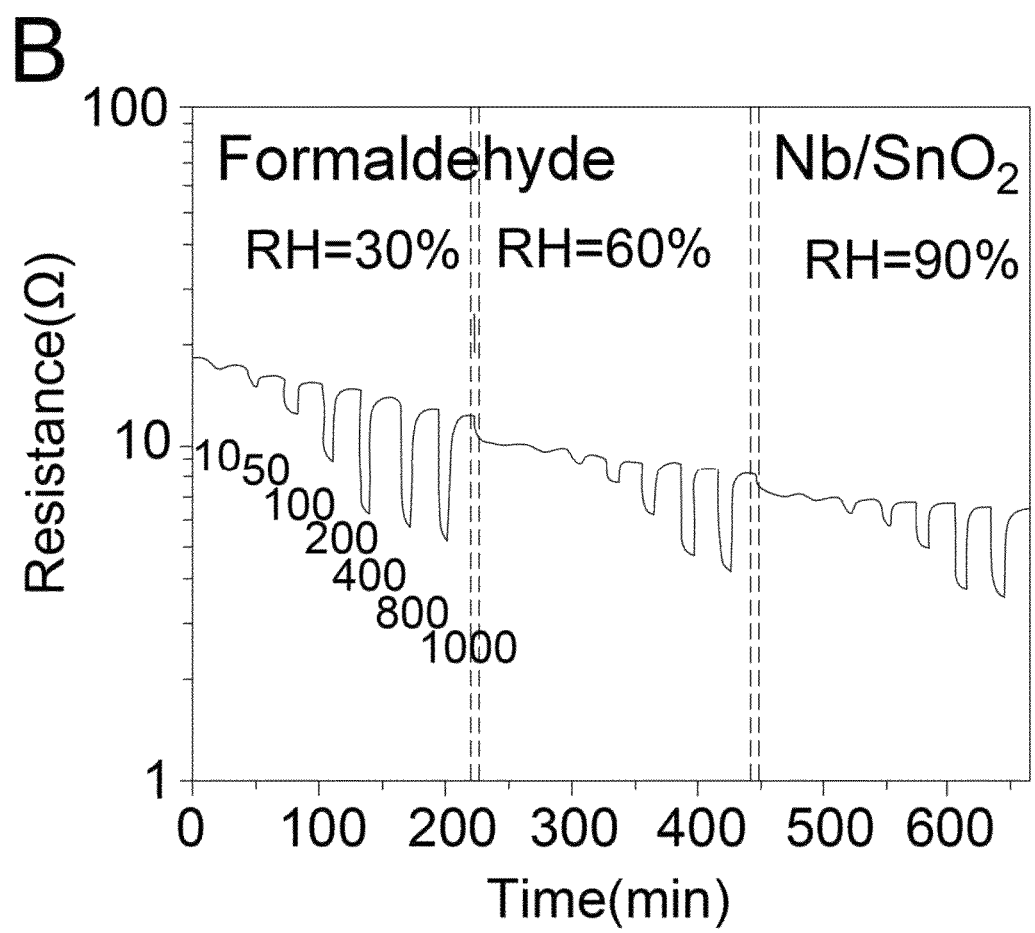
Figure 4C:
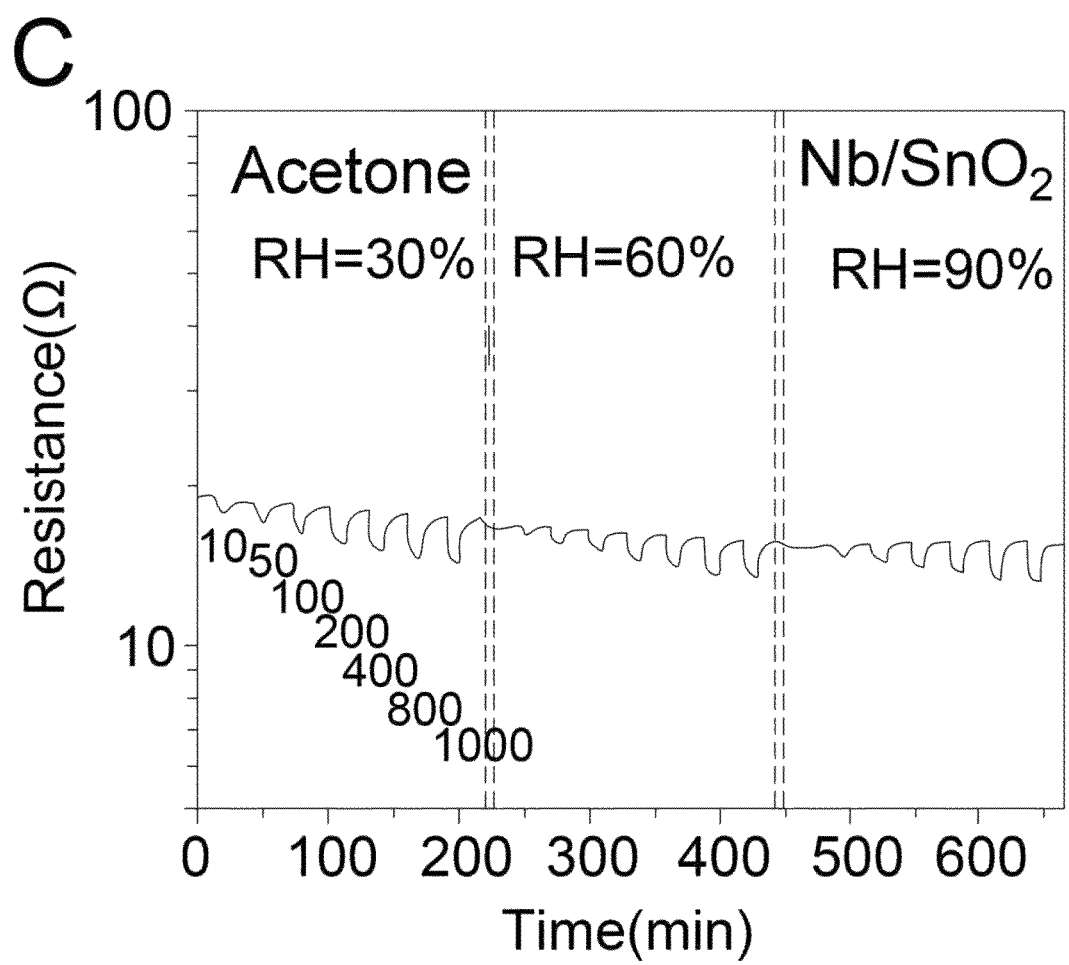

Room temperature gas-sensitive performance test was conducted on the $Nb/SnO_2$ gas sensor. The test results are shown in FIG. 4A to FIG. 4C. FIG. 4A to FIG. 4C show the resistance signal changes of the $Nb/SnO_2$ gas sensor in response to different concentrations (10-1000 ppb) of $H_2S$, formaldehyde, and acetone gas at different humidity levels (RH-30%, 60%, 90%). As can be seen from FIG. 4A to FIG. 4C, the $Nb/SnO_2$ gas sensor responds to all three gases under different humidity conditions, with detection concentrations as low as ppb level. The gas sensor still has gas detection capability in high humidity environments.

Figure 5A:
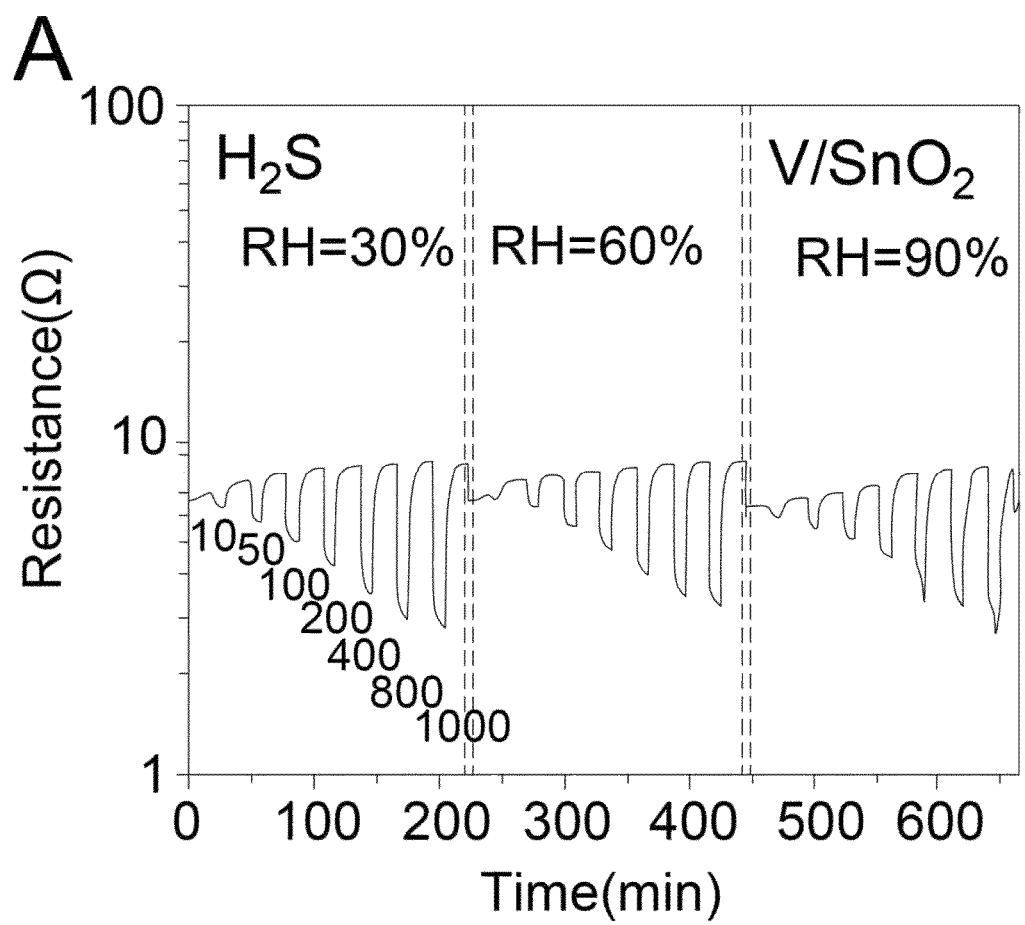
Figure 5B:
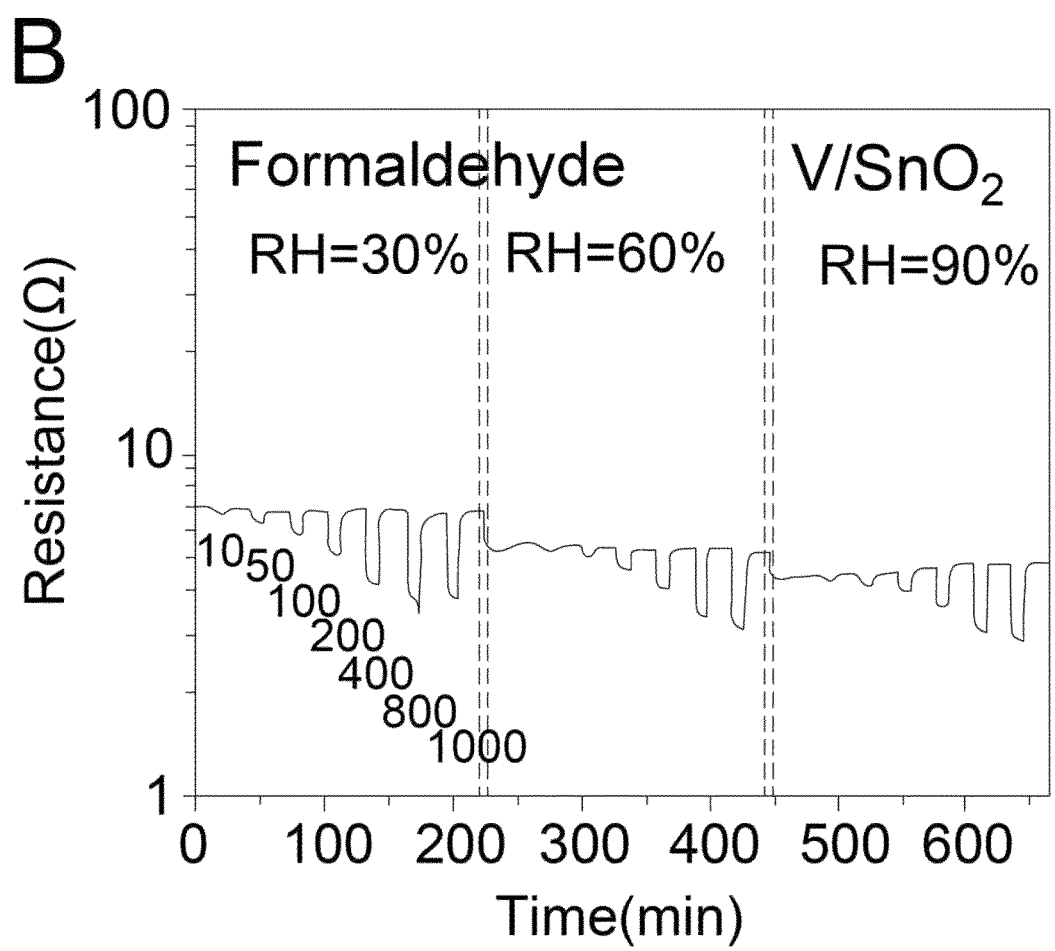
Figure 5C:
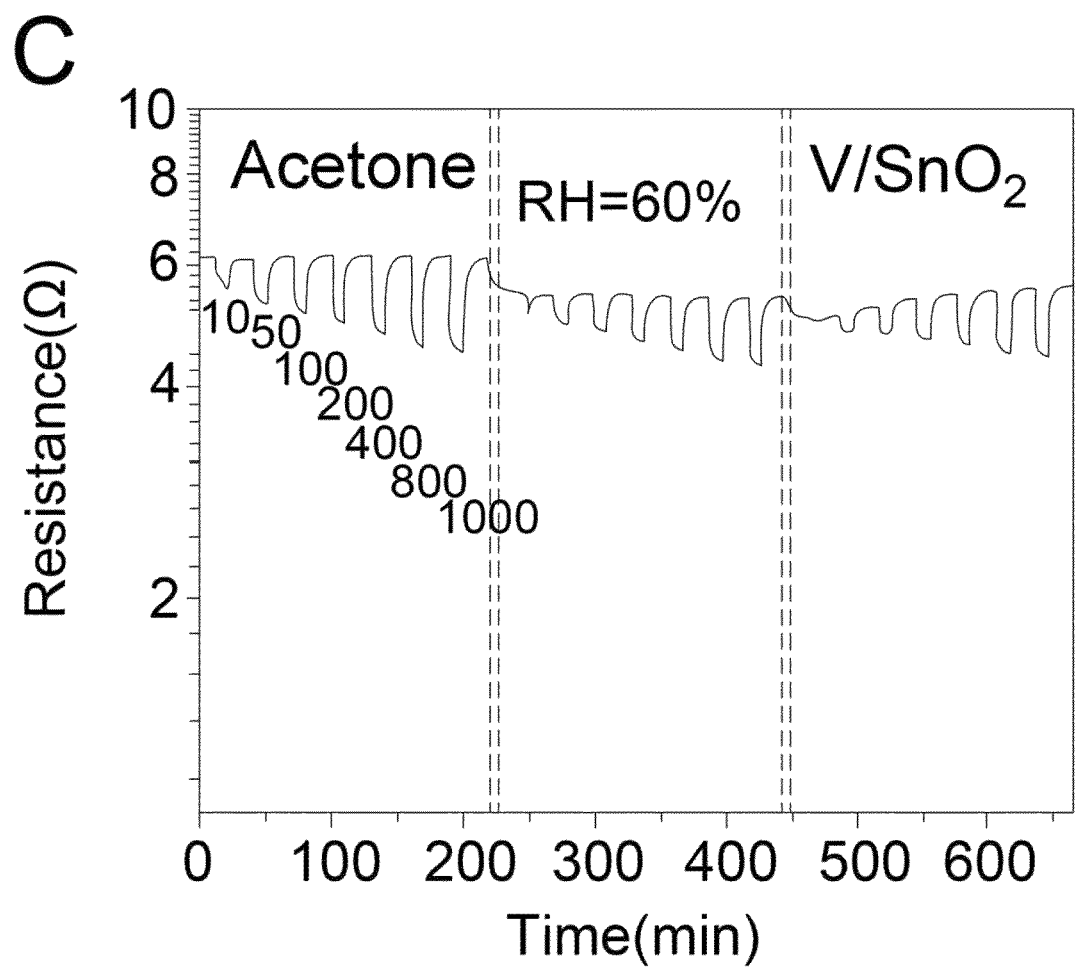

Room temperature gas-sensitive performance test was conducted on the $V/SnO_2$ gas sensor. The test results are shown in FIG. 5A to FIG. 5C. FIG. 5A to FIG. 5C show the resistance signal changes of the $V/SnO_2$ gas sensor in response to different concentrations (10-1000 ppb) of $H_2S$, formaldehyde, and acetone gas at different humidity levels (RH=30%, 60%, 90%). As can be seen from FIG. 5A to FIG. 5C, the $V/SnO_2$ gas sensor responds to all three gases under different humidity conditions, with detection concentrations as low as ppb level. The gas sensor still has gas detection capability in high humidity environments.

Example 3

A gas sensor array was prepared by randomly combining different doping types of colloidal metal oxide quantum wire gas sensors prepared in Example 2, i.e., four types of gas sensors, namely, a $V/SnO_2$ gas sensor, an $Nb/SnO_2$ gas sensor, a $Ta/SnO_2$ gas sensor, and a $SnO_2$ gas sensor and assembling them into a 2×2 sensor array as shown in FIG. 2B.

Figure 6A:
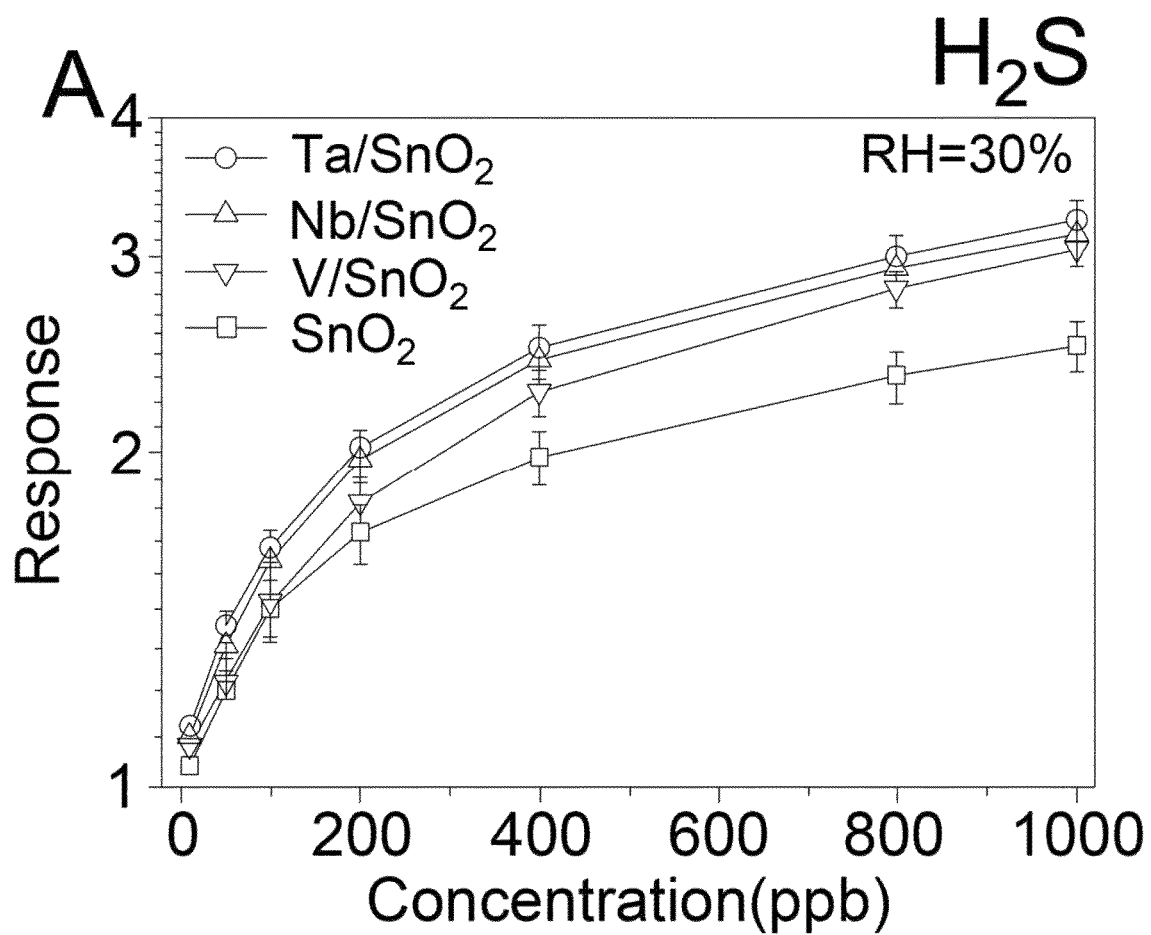
Figure 6B:
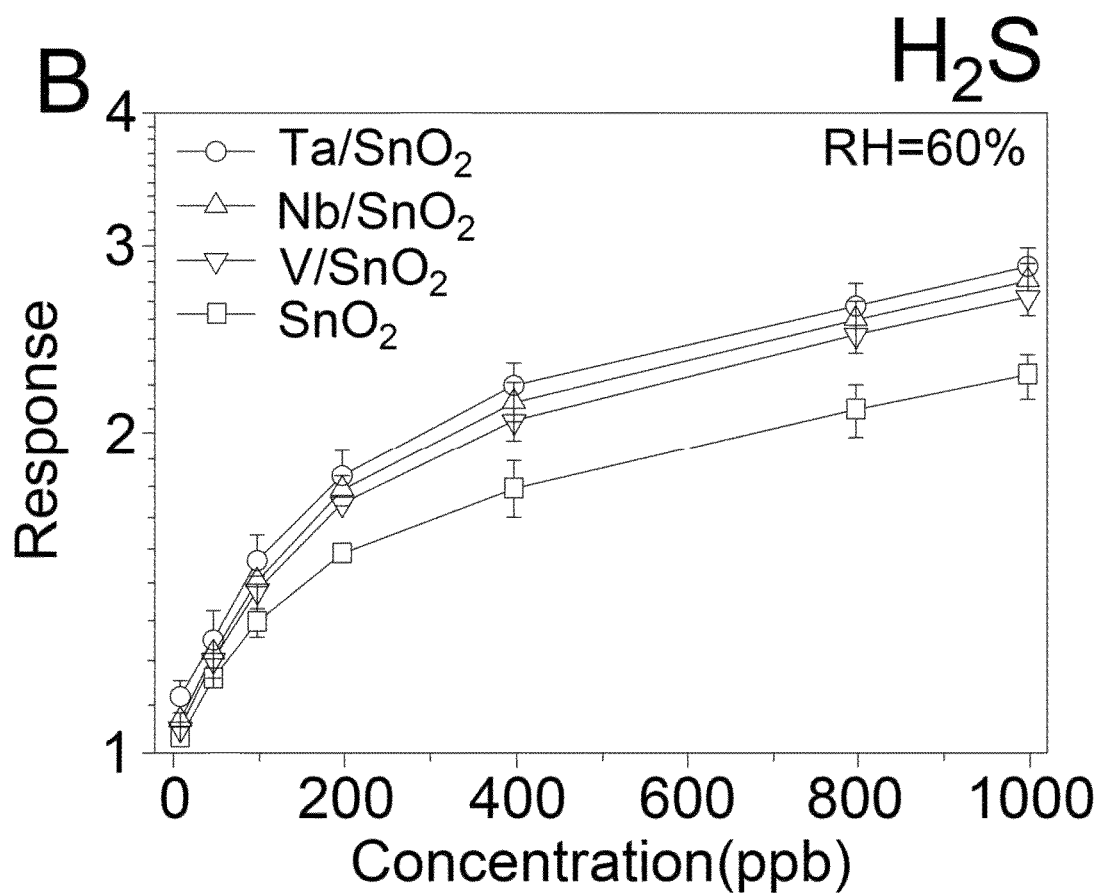
Figure 6C:
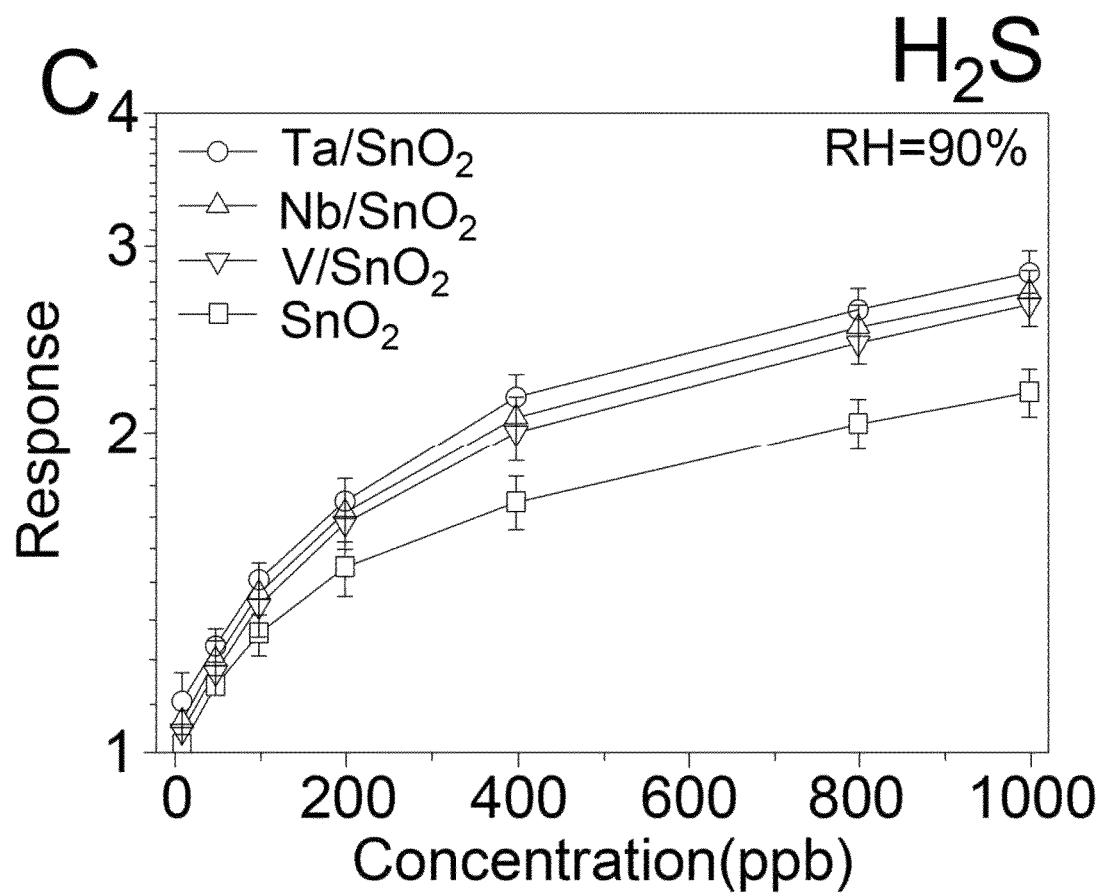
Figure 6D:
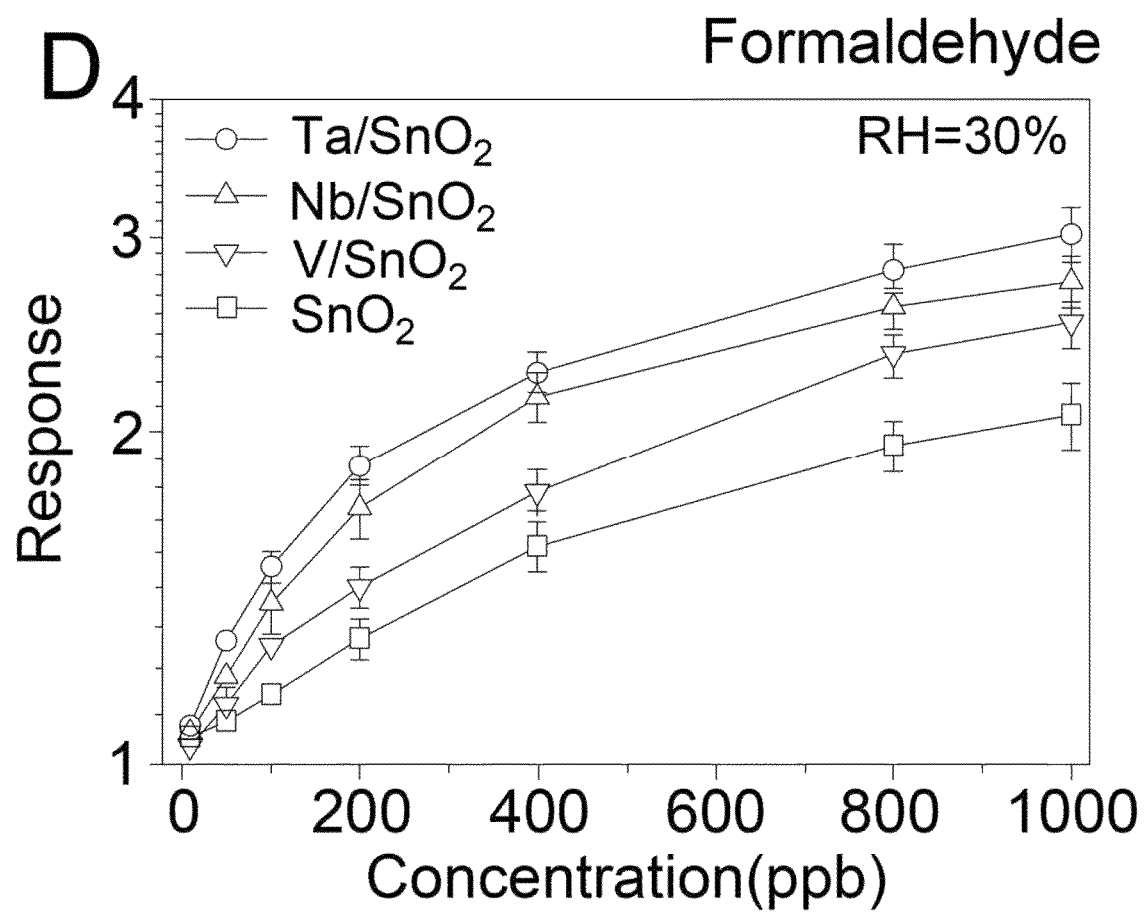
Figure 6E:
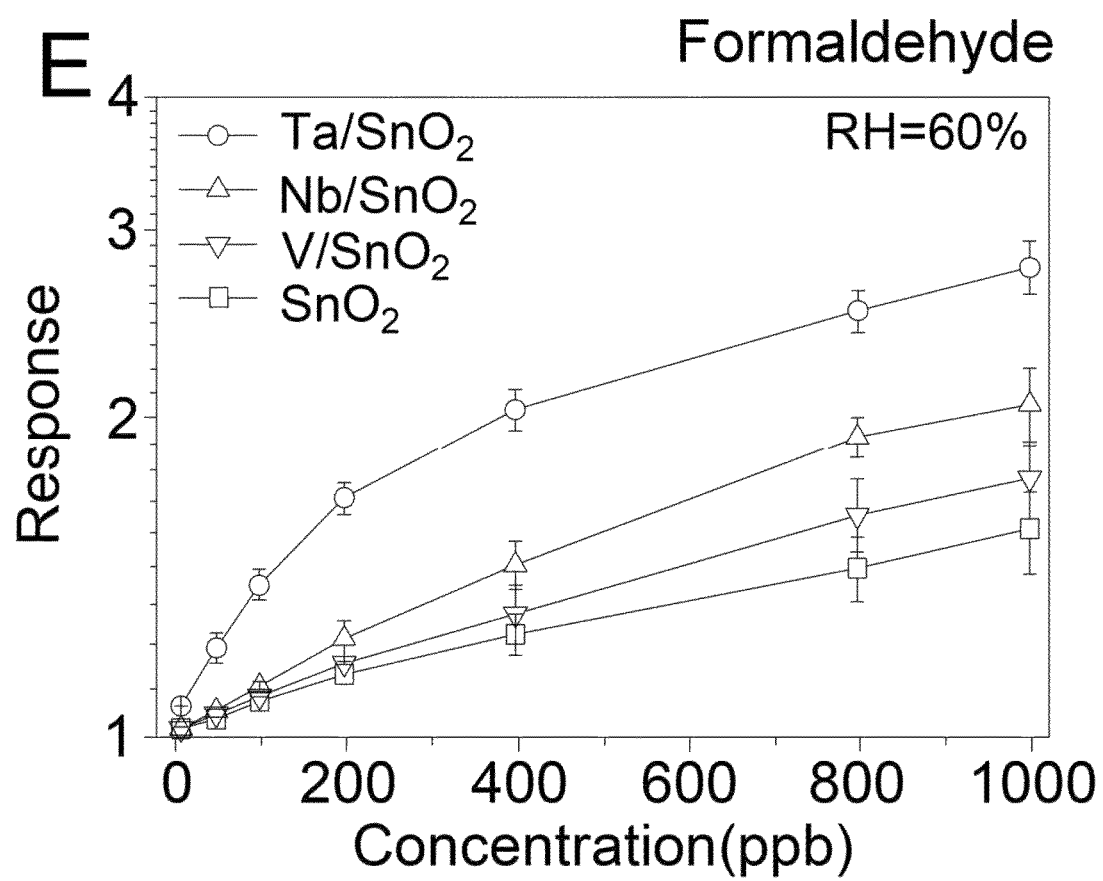
Figure 6F:
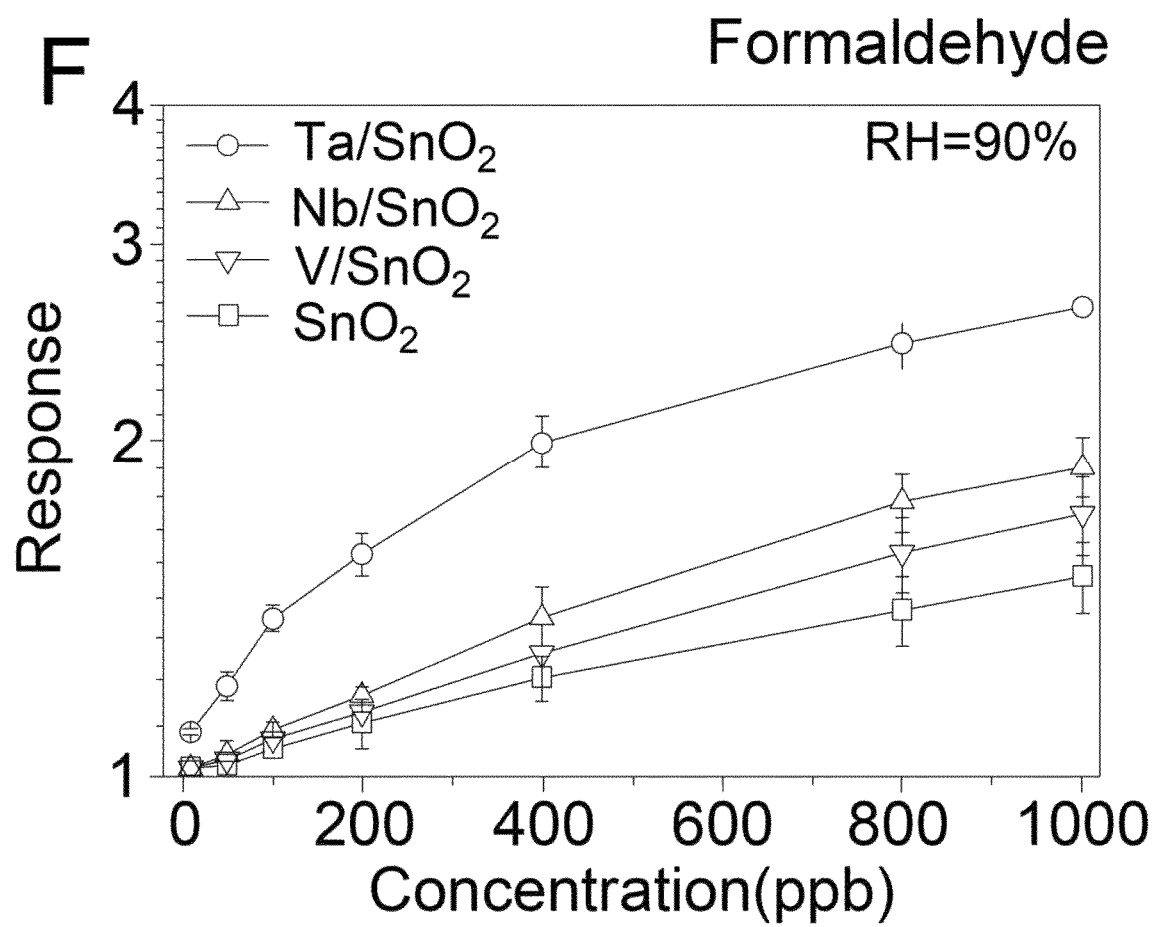
Figure 6G:
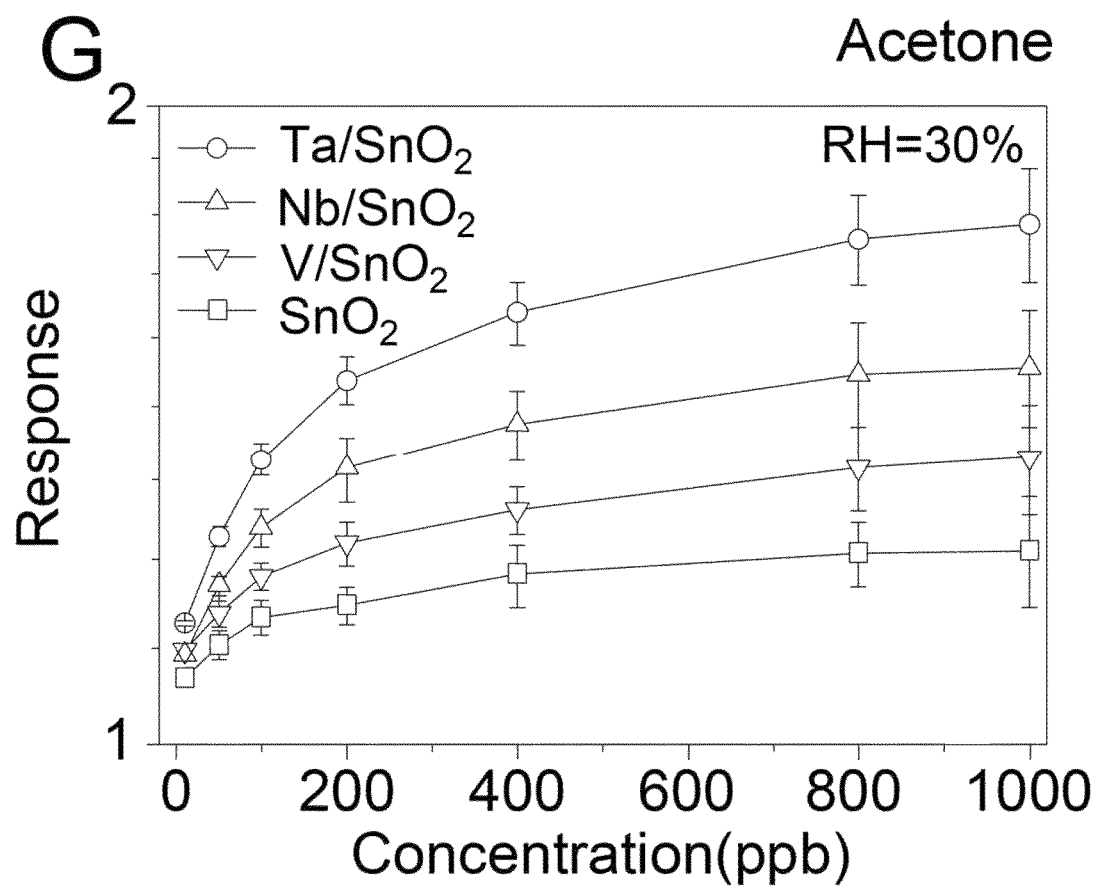
Figure 6H:
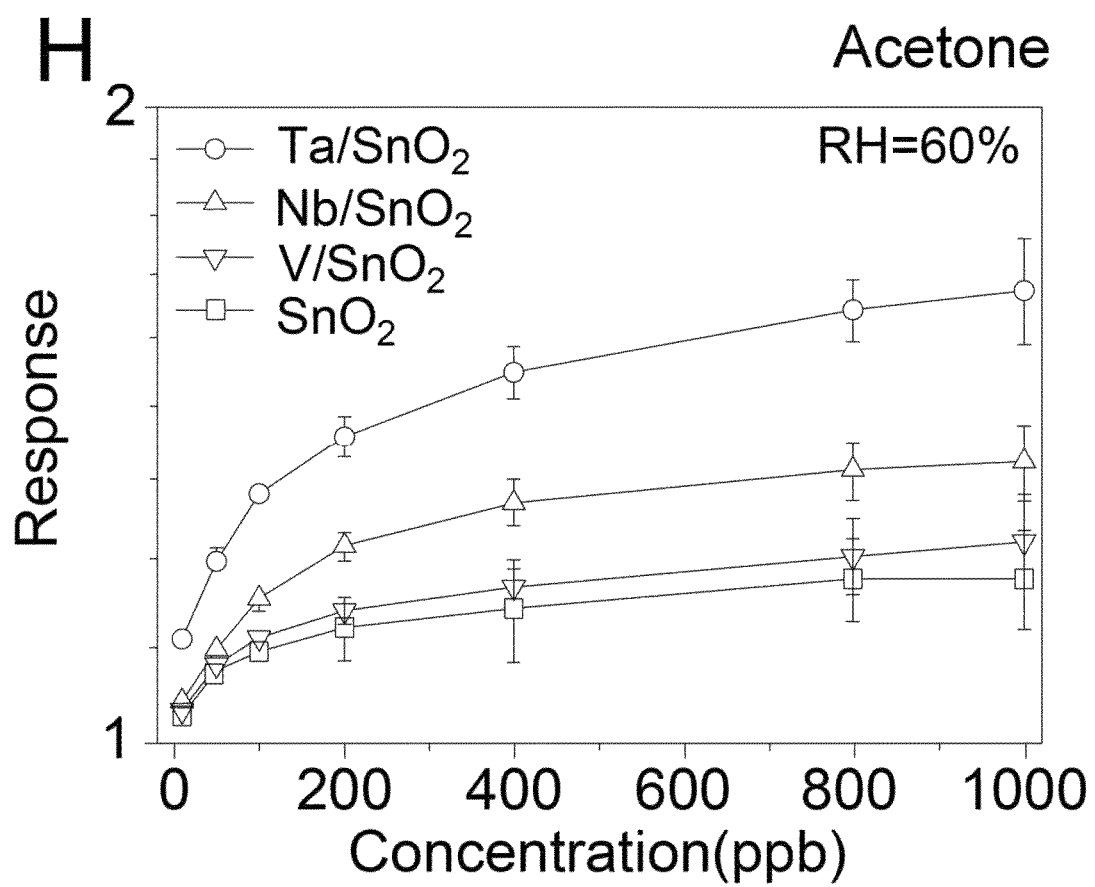
Figure 6I:
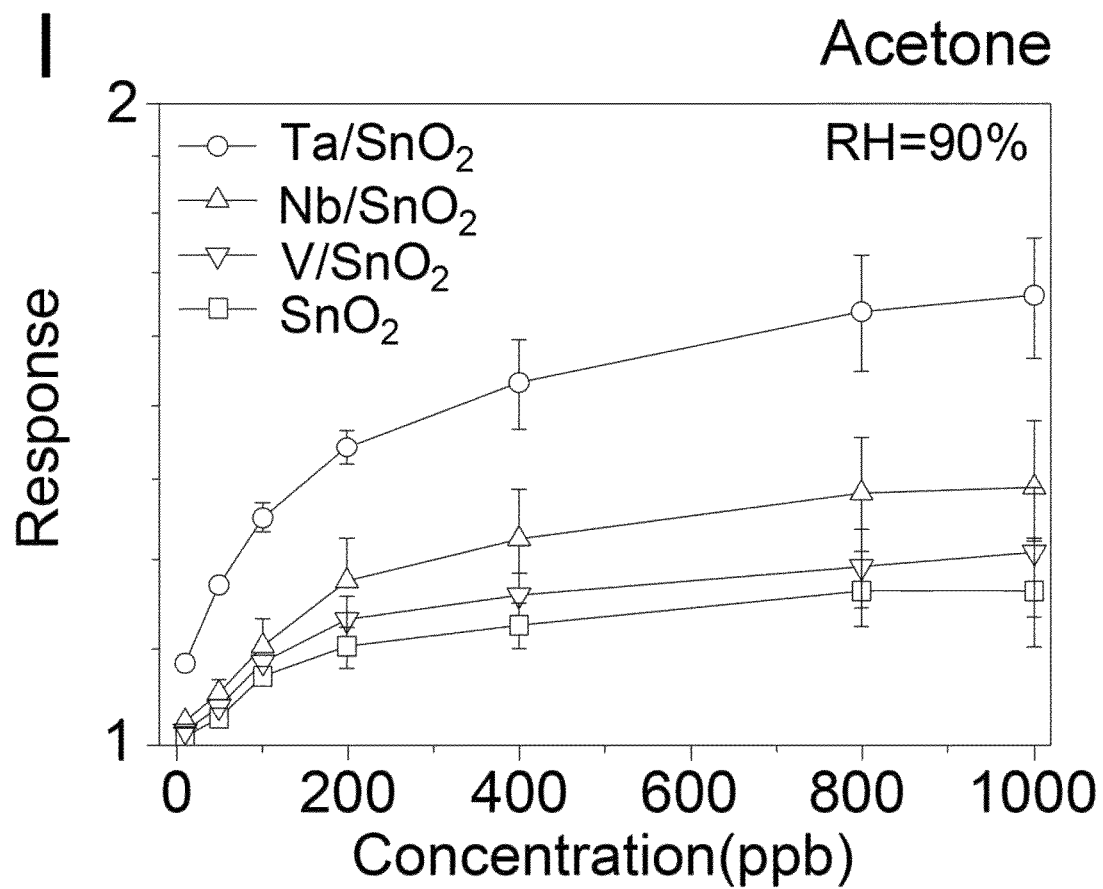

A single gas sensor responds to multiple gases and could not achieve selective recognition of the target gas. In this example, gas sensors were assembled into a sensor array. By testing the response sensitivity of the sensor arrays to different concentrations (10-1000 ppb) of $H_2S$, formaldehyde, and acetone gases at different humidity levels (30%, 60%, 90%), response sensitivity database of gas sensors to different gases were established. FIG. 6A to FIG. 6I show the diagrams of response sensitivity of four gas sensors when being in response to different concentrations of $H_2S$, formaldehyde, and acetone gas at different humidity levels, in which, FIG. 6A to FIG. 6C show the diagrams of response sensitivity of the four gas sensors when being in response to different concentrations (10-1000 ppb) of $H_2S$ at different humidity levels; FIG. 6D to FIG. 6F show the diagrams of response sensitivity of the four gas sensors when being in response to different concentrations (10-1000 ppb) of formaldehyde at different humidity levels; and FIG. 6G to FIG. 6I show the diagrams of response sensitivity of the four gas sensors when being in response to different concentrations (10-1000 ppb) of acetone at different humidity levels. By calculating the response values of the gas sensors to gases of different concentrations under different humidity levels, statistical analysis was conducted to obtain a response sensitivity database of the gas sensors to different gases.

Figure 7A:
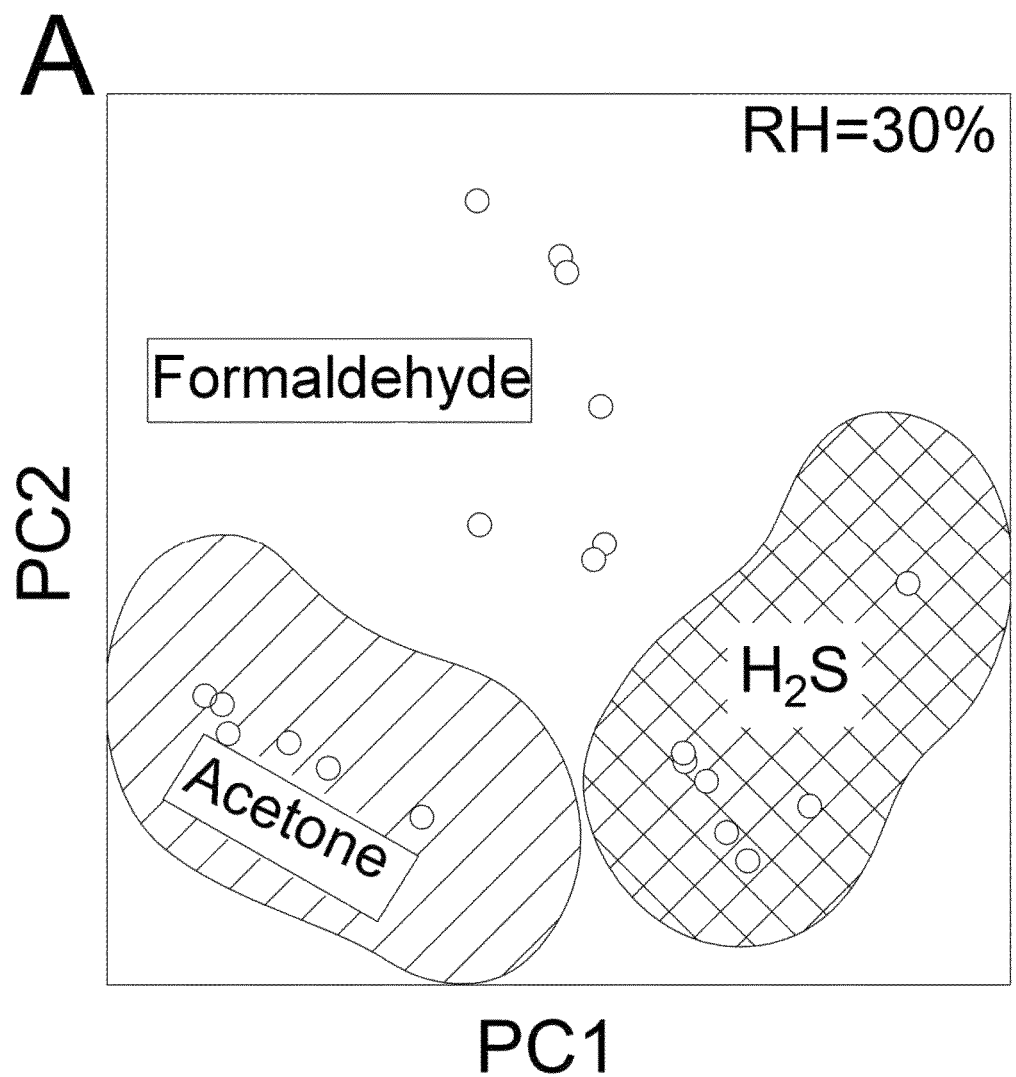
FIG. 7A to FIG. 7C show the diagrams of selective recognition of three different gases ($H_2S$, formaldehyde, and acetone gases) achieved by the 2×2 sensor array prepared in Example 3 combined with PCA algorithm under different humidity levels, in which, FIG. 7A to FIG. 7C correspond to selective effects under humidity levels of 30%, 60%, and 90%, respectively.
Figure 7B:
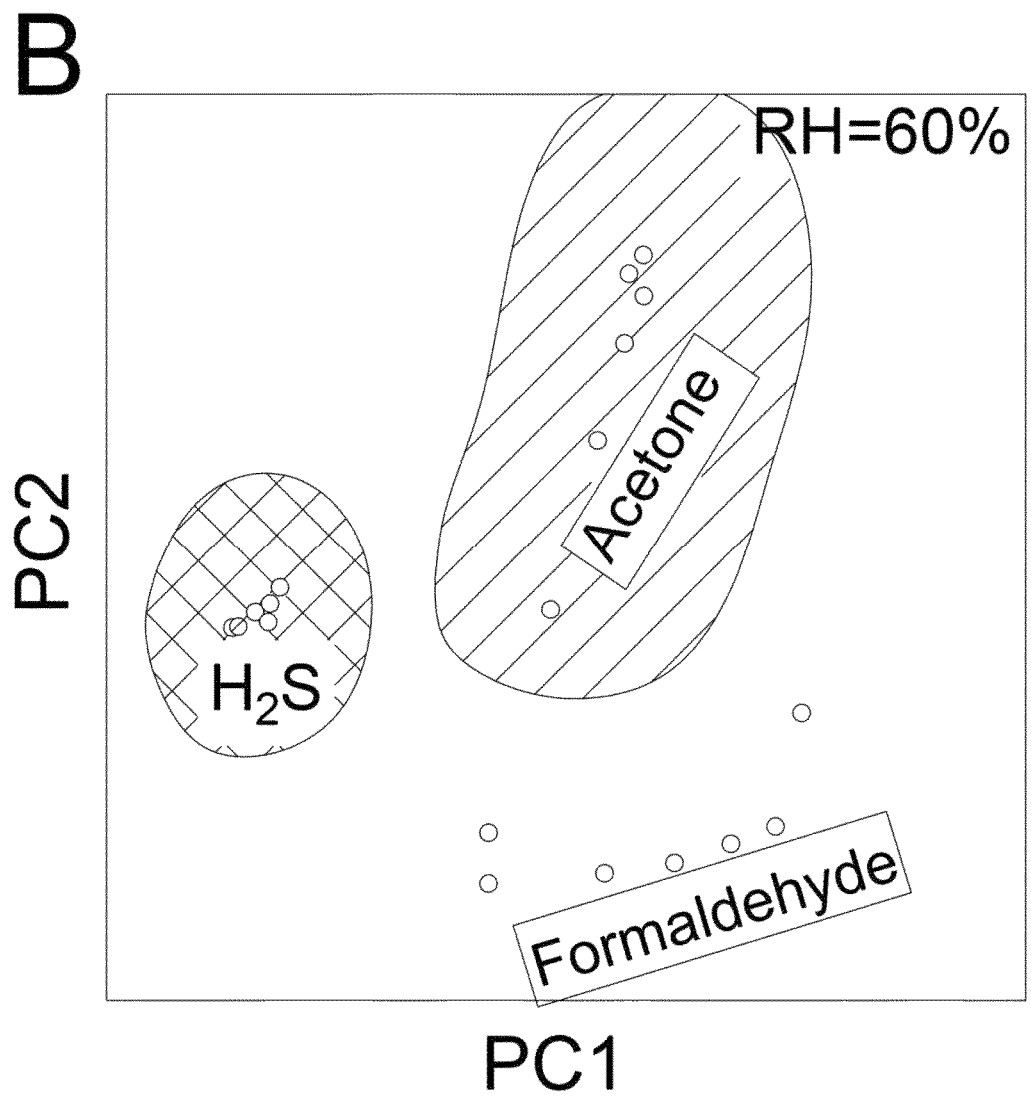
Figure 7C:
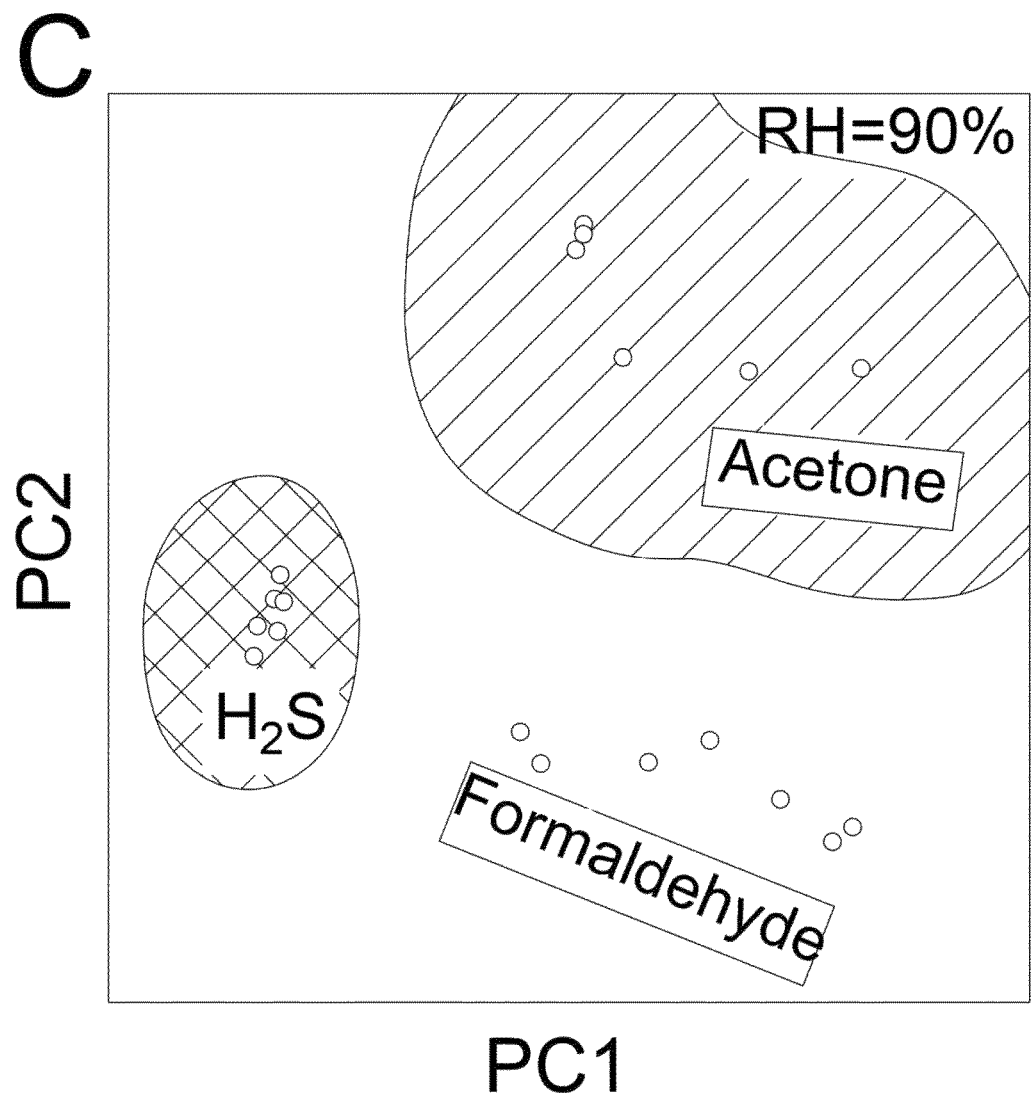

Selective identifications of $H_2S$, formaldehyde, and acetone gases were achieved in combination with principal component analysis (PCA) algorithm under different humidity levels (30%, 60%, 90%), and the analysis was performed as follows: 1) standardizing indicator data (such as response sensitivity, gas type, concentration) (automatically executed by software); 2) performing correlation judgment between indicators (linear or not); 3) determining a formula of principal component and establishing a model based on it. This 2× 2 sensor array could achieve independent differentiation of $H_2S$, formaldehyde, and acetone gases, each with its own region. FIG. 7A to FIG. 7C show the selective recognition effect of $H_2S$, formaldehyde, and acetone achieved by the 2× 2 sensor array combined with the PCA algorithm under different humidity levels, in which, FIG. 7A to FIG. 7C correspond to the effects under humidity levels of 30%, 60%, and 90%, respectively. As can be seen from FIG. 7A to FIG. 7C, different concentrations of formaldehyde, acetone, and $H_2S$ have their own attribution ranges. Based on the response characteristics of each gas and the combination with the PCA algorithm, the gas type could be identified when the result falls into its respective territory. Namely, when the unknown gas to be tested enters the gas sensor array and response starts, the unknown gas could be classified in combination with the pattern algorithm. After entering a specific area, the type of target gas could be identified. The specific analysis process of the pattern algorithm is as follows: 1) collecting data (such as the initial resistance value when in response to the unknown gas, and response sensitivity) and conducting indicator correlation analysis; 2) normalizing each indicator; 3) dividing the data into a training set and a testing set using sample data; 4) converting the data into formats which could be supported by the software; 5) selecting a kernel function; 6) selecting the optimal parameters for the training set by cross validation, and obtaining a model. Based on the analysis results of the model, unknown gases could be assigned, and the type of target gas could be identified after entering a specific area.

Example 4

According to the procedures in Example 1, $SnO_2$ colloidal quantum wires, $V/SnO_2$ colloidal quantum wires, $Nb/SnO_2$ colloidal quantum wires, $Ta/SnO_2$ colloidal quantum wires, ZnO colloidal quantum wires, V/ZnO colloidal quantum wires, Nb/ZnO colloidal quantum wires, Ta/ZnO colloidal quantum wires, $WO_3$ colloidal quantum wires, $V/WO_3$ colloidal quantum wires, $Nb/WO_3$ colloidal quantum wires, $Ta/WO_3$ colloidal quantum wires, $In_2O_3$ colloidal quantum wires, $V/In_2O_3$ colloidal quantum wire, $Nb/In_2O_3$ colloidal quantum wires, $Ta/In_2O_3$ colloidal quantum wires were prepared separately, except that types of precursors (chlorides) were replaced according to the compositions of the above colloidal quantum wires.

According to the procedures in Example 2, the aforementioned colloidal quantum wires were separately made into corresponding gas sensors.

The made $SnO_2$ gas sensor, $V/SnO_2$ gas sensor, $Nb/SnO_2$ gas sensor, $Ta/SnO_2$ gas sensor; ZnO gas sensors, V/ZnO gas sensors, Nb/ZnO gas sensors, Ta/ZnO gas sensors; $WO_3$ gas sensor, $V/WO_3$ gas sensor, $Nb/WO_3$ gas sensor, $Ta/WO_3$ gas sensor; $In_2O_3$ gas sensor, $V/In_2O_3$ gas sensor, $Nb/In_2O_3$ gas sensor, and $Ta/In_2O_3$ gas sensor were randomly combined and assembled into a 4×4 sensor array as shown in FIG. 2C. In addition, the gas sensor array in combination with the principal component analysis (PCA) algorithm could achieve selective differentiation of different gases (including $H_2S$, formaldehyde, acetone, CO, $CH_4$, $H_2$, toluene, and isobutene) under different humidity levels.

From the above embodiments, it can be seen that the gas sensor composed of the doped colloidal metal oxide quantum wires according to the present disclosure could be operated at room temperature, and realizes a lower detection limit for gas at ppb level. In addition, the gas sensor has the ability to resist humidity. In the present disclosure, gas sensors composed of doped colloidal metal oxide quantum wires as a gas-sensitive material are assembled into an array, which allows for selective recognition and detection of multiple gases.

The above are only preferred embodiments of the present disclosure. It should be pointed out that for persons of ordinary skill in the art, several improvements and embellishments could be made without departing from the principles of the present disclosure. These improvements and embellishments shall also be deemed as falling within the scope of the present disclosure.

What is claimed:

1. A gas sensor, comprising:
   a substrate with a sensing electrode deposited thereon, and
   a gas-sensitive material, being composited onto a surface of a side of the substrate where the sensing electrode is deposited, wherein
   the gas-sensitive material is a doped colloidal metal oxide quantum wire,
   a metal element of the metal oxide in the doped colloidal metal oxide quantum wire comprises a main metal element and a doped metal element,
   the main metal element is one selected from the group consisting of Sn, Zn, W, In, Mo, Fe, Co, Ni, and Cu;
   the doped metal element is at least one selected from the group consisting of V, Nb, Ta, Cr, Mo, W, Mn, Fe, Co, Ni, and Cu;
   the doped metal element is different from the main metal element;
   the doped colloidal metal oxide quantum wire has a diameter of 1-10 nm and further comprises a fatty acid surfactant at a surface of the doped colloidal metal oxide quantum wire;
   the fatty acid surfactant is octanoic acid;
   the doped colloidal metal oxide quantum wire is prepared by a method comprising the steps of
      mixing a main metal precursor, a doped metal precursor, an alcohol solvent, and the fatty acid surfactant, and subjecting a resulting mixture to a solvothermal reaction, to obtain the doped colloidal metal oxide quantum wire, wherein
      the main metal element in the main metal precursor is the one selected from the group consisting of Sn, Zn, W, In, Mo, Fe, Co, Ni, and Cu;
      the doped metal element in the doped metal precursor is the at least one selected from the group consisting of V, Nb, Ta, Cr, Mo, W, Mn, Fe, Co, Ni and Cu;
      a molar ratio of the doped metal element in the doped metal precursor to the main metal element in the main metal precursor is in a range of 1:100 to 1:20;
      the solvothermal reaction is performed at a temperature of 150-300° C.; and
      a mass ratio of the fatty acid surfactant to the alcohol solvent is in a range of 1:4 to 1:1; and
   the gas sensor is operable at room temperature, and has a detection limit for an unknown gas to be tested at a parts-per-billion (ppb) level.

2. The gas sensor as claimed in claim 1, wherein the main metal precursor is a chloride of the main metal element, and the doped metal precursor is a chloride of the doped metal element.

3. The gas sensor as claimed in claim 1, wherein the alcohol solvent comprises at least one selected from the group consisting of methanol, ethanol, and butanol; and a ratio of a sum of masses of the main metal precursor and the doped metal precursor to a mass of the alcohol solvent is in a range of 1:10 to 1:100.

4. The gas sensor as claimed in claim 1, wherein the solvothermal reaction is performed for 3-24 h.

5. A gas sensor array, comprising a plurality of gas sensors, wherein the plurality of gas sensors comprise the gas sensor as claimed in claim 1.

6. A method of selective recognition of an unknown gas to be tested, comprising:
   (a) providing the gas sensor array of claim 5;
   (b) testing response sensitivity of the gas sensor array to different concentrations of different gases at different humidity levels, and establishing a response sensitivity database of the gas sensor array to the different gases;
   (c) performing principal component analysis (PCA) on response sensitivity data of the plurality of gas sensors in the response sensitivity database to the different gases, to achieve independent differentiation for the different gases, with each gas having its own region; and
   (d) introducing the unknown gas to be tested to the gas sensor array where a response starts, analyzing response sensitivity data obtained using pattern algorithms, classifying the unknown gas to be tested based on analysis results, and identifying what type the unknown gas to be tested is after entering a specific region;
      wherein the unknown gas to be tested comprises at least one selected from the group consisting of $H_2S$, formaldehyde, acetone, CO, $CH_4$, $H_2$, toluene, and isobutene.

7. The gas sensor array as claimed in claim 5, wherein the main metal precursor is a chloride of the main metal element, and the doped metal precursor is a chloride of the doped metal element.

8. The gas sensor array as claimed in claim 5, wherein the alcohol solvent comprises at least one selected from the group consisting of methanol, ethanol, and butanol; and a ratio of a sum of masses of the main metal precursor and the doped metal precursor to a mass of the alcohol solvent is in a range of 1:10 to 1:100.

9. The gas sensor array as claimed in claim 5, wherein the solvothermal reaction is performed for 3-24 h.

10. A gas sensor, comprising:
    a substrate with a sensing electrode deposited thereon, and
    a gas-sensitive material, being composited onto a surface of a side of the substrate where the sensing electrode is deposited, wherein
    the gas-sensitive material is a doped colloidal metal oxide quantum wire,
    a metal element of the metal oxide in the doped colloidal metal oxide quantum wire comprises a main metal element and a doped metal element,
    the main metal element is one selected from the group consisting of Sn, Zn, W, In, Mo, Fe, Co, Ni, and Cu;
    the doped metal element is at least one selected from the group consisting of V, Nb, Ta, Cr, Mo, W, Mn, Fe, Co, and Cu;
    the doped metal element is different from the main metal element;

the doped colloidal metal oxide quantum wire has a diameter of 1-10 nm and further comprises a fatty acid surfactant at a surface of the doped colloidal metal oxide quantum wire;

the fatty acid surfactant has 8-10 carbon atoms;

the doped colloidal metal oxide quantum wire is prepared by a method comprising the steps of mixing a main metal precursor, a doped metal precursor, an alcohol solvent, and the fatty acid surfactant, and subjecting a resulting mixture to a solvothermal reaction, to obtain the doped colloidal metal oxide quantum wire, wherein the main metal element in the main metal precursor is the one selected from the group consisting of Sn, Zn, W, In, Mo, Fe, Co, Ni, and Cu;

the doped metal element in the doped metal precursor is the at least one selected from the group consisting of V, Nb, Ta, Cr, Mo, W, Mn, Fe, Co, and Cu;

a molar ratio of the doped metal element in the doped metal precursor to the main metal element in the main metal precursor is in a range of 1:100 to 1:20;

the solvothermal reaction is performed at a temperature of 150-300° C.; and a mass ratio of the fatty acid surfactant to the alcohol solvent is in a range of 1:4 to 1:1; and the gas sensor is operable at room temperature, and has a detection limit for an unknown gas to be tested at a parts-per-billion (ppb) level.

11. The gas sensor as claimed in claim 10, wherein the fatty acid surfactant is octanoic acid.

12. The gas sensor as claimed in claim 10, wherein the fatty acid surfactant is decanoic acid.

* * * * *